(12) United States Patent
Wang et al.

(10) Patent No.: US 12,113,006 B2
(45) Date of Patent: *Oct. 8, 2024

(54) SEMICONDUCTOR PACKAGE

(71) Applicant: Taiwan Semiconductor Manufacturing Company, Ltd., Hsinchu (TW)

(72) Inventors: Chin-Hua Wang, New Taipei (TW); Shu-Shen Yeh, Taoyuan (TW); Yu-Sheng Lin, Hsinchu (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/080,683

(22) Filed: Dec. 13, 2022

(65) Prior Publication Data
US 2023/0115745 A1    Apr. 13, 2023

Related U.S. Application Data

(63) Continuation of application No. 17/213,184, filed on Mar. 25, 2021, now Pat. No. 11,574,861.

(51) Int. Cl.
*H01L 23/498* (2006.01)
*H01L 23/00* (2006.01)
(Continued)

(52) U.S. Cl.
CPC .... *H01L 23/49838* (2013.01); *H01L 23/3128* (2013.01); *H01L 23/49816* (2013.01);
(Continued)

(58) Field of Classification Search
CPC ......... H01L 23/49822; H01L 23/49833; H01L 24/13; H01L 24/16; H01L 24/32;
(Continued)

(56) References Cited

U.S. PATENT DOCUMENTS 9,000,584 B2    4/2015  Lin et al.
9,048,222 B2    6/2015  Hung et al.
(Continued)

*Primary Examiner* — Douglas W Owens
(74) *Attorney, Agent, or Firm* — JCIPRNET

(57) ABSTRACT

A semiconductor package includes an interposer, a semiconductor die, an underfill layer and an encapsulant. The semiconductor die is disposed over and electrically connected with the interposer, wherein the semiconductor die has a front surface, a back surface, a first side surface and a second side surface, the back surface is opposite to the front surface, the first side surface and the second side surface are connected with the front surface and the back surface, and the semiconductor die comprises a chamfered corner connected with the back surface, the first side surface and the second side surface, the chamfered corner comprises at least one side surface. The underfill layer is disposed between the front surface of the semiconductor die and the interposer. The encapsulant laterally encapsulates the semiconductor die and the underfill layer, wherein the encapsulant is in contact with the chamfered corner of the semiconductor die.

20 Claims, 28 Drawing Sheets

(51) Int. Cl.
*H01L 23/31* (2006.01)
*H01L 25/065* (2023.01)

(52) U.S. Cl.
CPC .. *H01L 23/49822* (2013.01); *H01L 23/49833* (2013.01); *H01L 24/13* (2013.01); *H01L 24/16* (2013.01); *H01L 24/32* (2013.01); *H01L 24/33* (2013.01); *H01L 25/0655* (2013.01); *H01L 2224/13023* (2013.01); *H01L 2224/1357* (2013.01); *H01L 2224/16235* (2013.01); *H01L 2224/32225* (2013.01); *H01L 2224/3303* (2013.01); *H01L 2224/33179* (2013.01); *H01L 2924/182* (2013.01)

(58) Field of Classification Search
CPC ................ H01L 24/33; H01L 25/0655; H01L 2224/13023; H01L 2224/16235; H01L 2224/33179; H01L 23/3737; H01L 21/563; H01L 23/3185
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,557,559 B2 * | 1/2023 | Lee ........................ H01L 21/563 |
| 11,574,861 B2 * | 2/2023 | Wang .................. H01L 21/6835 |
| 2017/0309579 A1 * | 10/2017 | Wang .................. H01L 23/3114 |

* cited by examiner

SEMICONDUCTOR PACKAGE

CROSS-REFERENCE TO RELATED APPLICATION

This application is a continuation application of and claims the priority benefit of a prior application Ser. No. 17/213,184, filed on Mar. 25, 2021. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, integrated fan-out packages are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
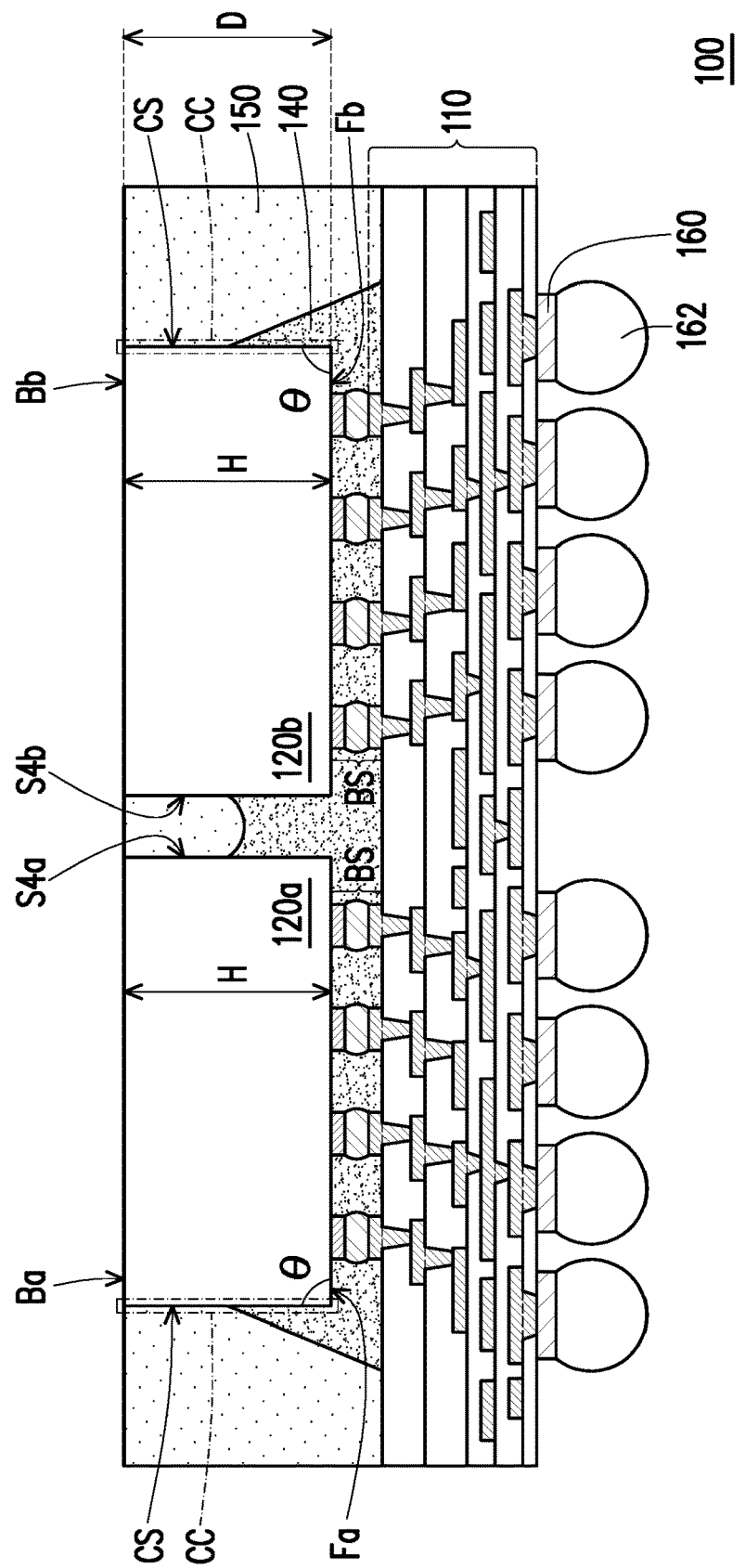
FIG. 1 is a schematic cross-sectional view of a semiconductor package in accordance with some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 2:
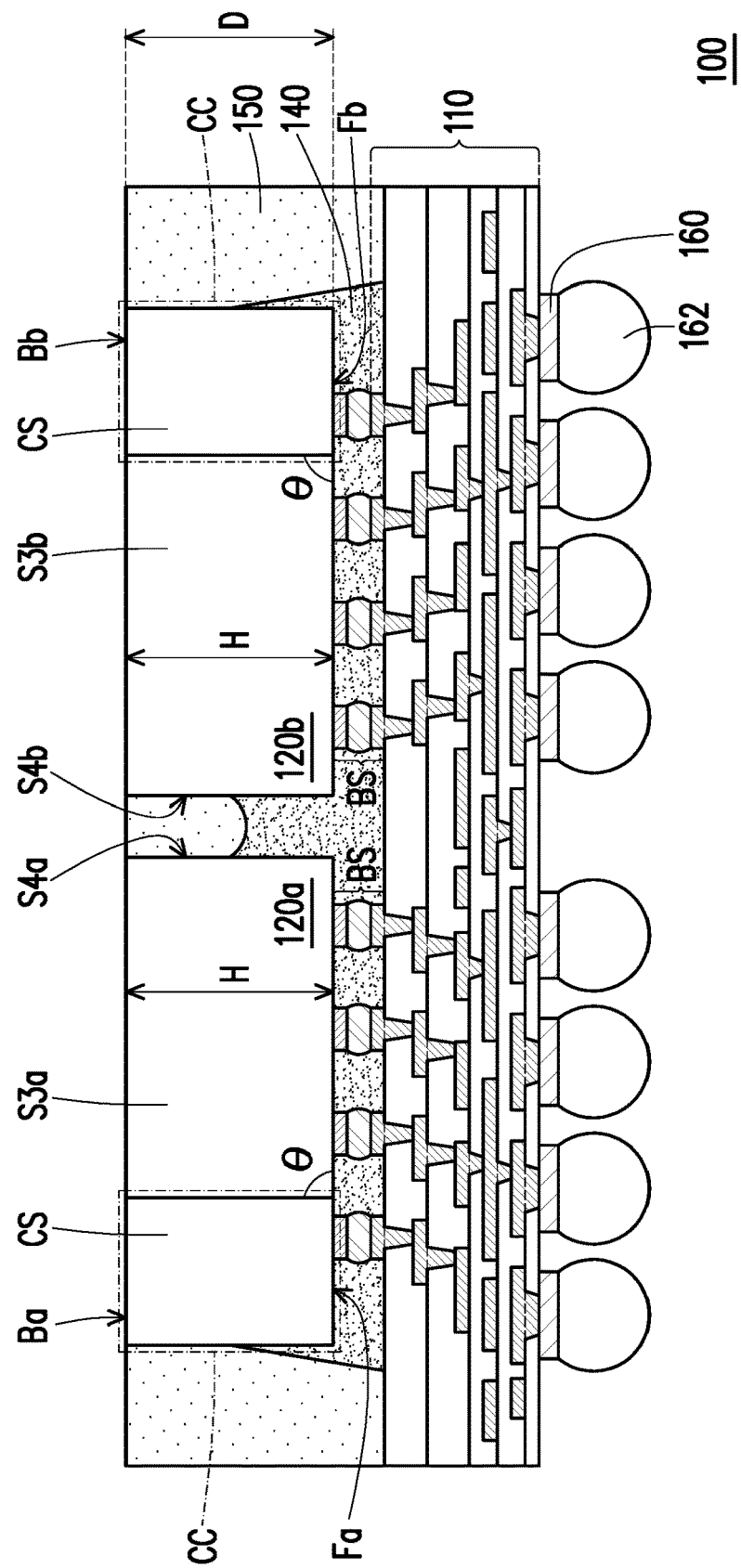
FIG. 2 is a simplified side view of a semiconductor package in accordance with some embodiments of the disclosure.
Figure 3:
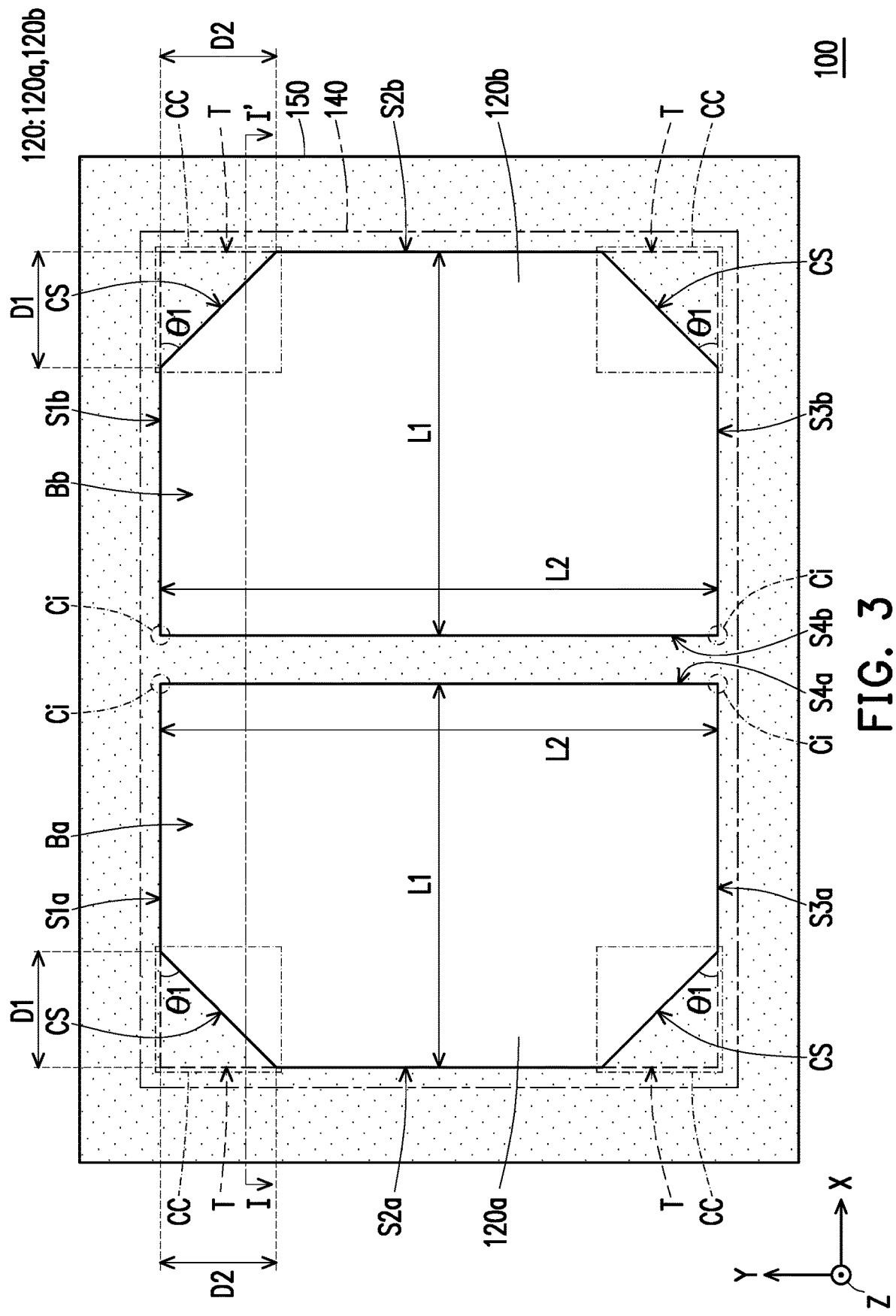
FIG. 3 is a simplified top view of a semiconductor package in accordance with some embodiments of the disclosure.

FIG. 1 is a schematic cross-sectional view of a semiconductor package 100 in accordance with some embodiments of the disclosure. FIG. 2 is a simplified side view of a semiconductor package in accordance with some embodiments of the disclosure. FIG. 3 is a simplified top view of the semiconductor package 100 in accordance with some embodiments of the disclosure. Specifically, FIG. 1 is a cross-sectional view taken along the line I-I' of FIG. 3, and FIG. 2 is a side view viewed from the side surfaces S3a, S3b along a direction Y in FIG. 3. For simplicity and clarity of illustration, some elements are omitted in the simplified top view of FIG. 3, and these elements might not be locates in the same plane. The semiconductor package 100 may be an integrated fan-out ("InFO") package.

Referring to FIG. 1, FIG. 2 and FIG. 3, the semiconductor package 100 includes an interposer 110, a semiconductor die 120a, a semiconductor die 120b, an underfill layer 140 and an encapsulant 150. In some embodiments, the semiconductor package 100 further includes a plurality of under-ball metallurgy (UBM) patterns 160 and a plurality of conductive terminals 162. It is noted that when it is not necessary to differentiate between the semiconductor dies 120a and 120b, the semiconductor dies 120a and 120b may be collectively referred to as semiconductor dies 120. The semiconductor dies 120 are disposed over and electrically connected with the interposer 110. As shown in FIG. 1, the semiconductor die 120 is electrically connected with the interposer 110 through bonding structures BS. The semiconductor dies 120 are arranged side by side over the interposer 110. In detail, as shown in FIG. 2 and FIG. 3, the side surface S4a of the semiconductor die 120a faces toward the side surface S4b of the semiconductor die 120b, the side surfaces S1a-S3a of the semiconductor die 120a do not face toward the semiconductor die 120b, and the side surfaces S1b-S3b of the semiconductor die 120b do not face toward the semiconductor die 120a. As such, the side surfaces S1a-S3a and the side surfaces S1b-S3b may be referred to as outer side surfaces, and the side surface S4a and the side surface S4b may be referred to as inner side surfaces. As shown in FIG. 1, FIG. 2 and FIG. 3, each of the side surfaces S1a-S4a of the semiconductor die 120a is connected with the front surface Fa (i.e., the illustrated bottom surface) and the back surface Ba (i.e., the illustrated top surface) of the semiconductor die 120a, and each of the side surfaces S1b-S4b of the semiconductor die 120b is connected with the front surface Fb (i.e., the illustrated bottom surface) and the back surface Bb (i.e., the illustrated top surface) of the semiconductor die 120b. The back surface Ba is opposite to the front surface Fa, and the back surface Bb is opposite to the front surface Fb. The front surface Fa faces toward the interposer 110, and the front surface FB faces toward the interposer 110.

The underfill layer 140 is located between the semiconductor dies 120, and between the semiconductor dies 120 and the interposer 110. As shown in FIG. 1, FIG. 2 and FIG. 3, each of the semiconductor die 120 is partially wrapped around by the underfill layer 140. That is to say, the underfill layer 140 covers a portion of each of the side surfaces S1a-S4a of the semiconductor die 120a, and a portion of each of the side surfaces S1b-S4b of the semiconductor die 120b. Further, as shown in FIG. 1, the underfill layer 140 is located between the interposer 110 and the front surface Fa of the semiconductor die 120a, and between the interposer 110 and the front surface Fb of the semiconductor die 120b. In addition, the underfill layer 140 surrounds each bonding structure BS. Owing to the underfill layer 140, a bonding strength between the semiconductor die 120 and the interposer 110 is enhanced, thereby improving the reliability of the semiconductor package 100. The encapsulant 150 encapsulates the semiconductor dies 120 and the underfill layer 140. The UBM patterns 160 and the conductive terminals 162 are disposed on the interposer 110 opposite to the semiconductor dies 120. That is to say, the UBM patterns 160 and the conductive terminals 162 are arranged at one side of the interposer 110 opposite to another one side where the semiconductor dies 120 are disposed. Further, the UBM patterns 160 and the conductive terminals 162 are electrically connected with the interposer 110. That is to say, in embodiments, the UBM patterns 160 and the conductive terminals 162 are electrically connected with the semiconductor dies 120 through the interposer 110.

The semiconductor dies 120 may each have a single function (e.g., a logic die, memory die, etc.), or may have multiple functions (e.g., a system on a chip (SoC), an application-specific integrated circuit (ASIC), etc.). In some embodiments, the semiconductor dies 120 have different functions and properties. It is appreciated that dies diced from different semiconductor wafers may have different properties and functions. Accordingly, in some embodiments that the semiconductor dies 120 have different functions, the semiconductor dies 120 are singulated from different semiconductor wafers. In some alternative embodiments, the semiconductor dies 120 have the same function and property, and are singulated from the same semiconductor wafer. That is to say, in the semiconductor package 100, the semiconductor dies 120 are different types of semiconductor dies or the same type of semiconductor die. In some embodiments, the semiconductor die 120a is a SoC, and the semiconductor die 120b is a memory die. The memory die may be a dynamic random access memory (DRAM) die, a static random access memory (SRAM) die, a hybrid memory cube (HMC) die, a high bandwidth memory (HBM) die, or the like. In an embodiment, the semiconductor die 120a is a SoC, and the semiconductor die 120b is a HBM die. Furthermore, in some embodiments, the semiconductor dies 120 may be in different sizes (e.g., different heights and/or surface areas). In some alternative embodiments, the semiconductor dies 120 may be in the same size (e.g., same heights and/or surface areas). That is to say, in the semiconductor package 100, the semiconductor dies 120 are in different sizes or in the same size.

As shown in FIG. 1, FIG. 2 and FIG. 3, although two semiconductor dies 120 are presented in the semiconductor package 100 for illustrative purposes, those skilled in the art can understand that the number of the semiconductor dies 120 may be more than or less than what is depicted in FIG.

1, FIG. 2 and FIG. 3, and may be designated based on demand and/or design layout. Further, as shown in FIG. 1, although four bonding structures BS corresponding to one semiconductor die 120 are presented in the semiconductor package 100 for illustrative purposes, those skilled in the art can understand that the number of the bonding structures BS corresponding to one semiconductor die 120 may be more than or less than what is depicted in FIG. 1, and may be designated based on demand and/or design layout. Further, as shown in FIG. 1, although eight UBM patterns 160 and eight conductive terminals 162 are presented in the semiconductor package 100 for illustrative purposes, those skilled in the art can understand that the number of the UBM patterns 160 and the number of the conductive terminals 162 may be more than or less than what is depicted in FIG. 1, and may be designated based on demand and/or design layout.

As shown in FIG. 1, FIG. 2 and FIG. 3, each of the semiconductor dies 120 includes two chamfered corners CC. That is to say, the semiconductor dies 120 may be referred to as chamfered semiconductor dies. As shown in FIG. 3, from the top view, in the semiconductor die 120a, one of the chamfered corners CC is connected with the back surface Ba, the side surface S1a and the side surface S2a, and another one of the chamfered corners CC is connected with the back surface Ba, the side surface S2a and the side surface S3a; and in the semiconductor die 120b, one of the chamfered corners CC is connected with the back surface Bb, the side surface S1b and the side surface S2b, and another one of the chamfered corners CC is connected with the back surface Ba, the side surface S2b and the side surface S3b. From another point of view, as shown in FIG. 3, in the semiconductor die 120a, the chamfered corner CC is connected with two outer side surfaces (e.g., the side surface S1a and the side surface S2a, or the side surface S2a and the side surface S3a) without facing toward any other semiconductor die (e.g., the semiconductor die 120b); and in the semiconductor die 120b, the chamfered corner CC is connected with two outer side surfaces (e.g., the side surface S1b and the side surface S2b, or the side surface S2b and the side surface S3b) without facing toward any other semiconductor die (e.g., the semiconductor die 120a). As such, the chamfered corners CC of the semiconductor dies 120 may be referred to as chamfered outer corners. In other words, in the semiconductor die 120, the outer corner formed by two outer side surfaces (e.g., the side surface S1a and the side surface S2a, the side surface S2a and the side surface S3a, the side surface S1b and the side surface S2b, or the side surface S2b and the side surface S3b) without facing toward any other semiconductor die is chamfered with the chamfered corner CC. Also, the chamfered corners CC of the semiconductor die 120a do not face toward the semiconductor die 120b, and the chamfered corners CC of the semiconductor die 120b do not face toward the semiconductor die 120a.

In some embodiments, as shown in FIG. 1, FIG. 2 and FIG. 3, the chamfered corner CC includes a side surface CS. In detail, as shown in FIG. 3, from the top view, in the semiconductor die 120a, the side surface CS of the chamfered corner CC connected with the side surface S1a and the side surface S2a extends between the side surface S1a and the side surface S2a, and the side surface CS of the chamfered corner CC connected with the side surface S2a and the side surface S3a extends between the side surface S2a and the side surface S3a; and in the semiconductor die 120b, the side surface CS of the chamfered corner CC connected with the side surface S1b and the side surface S2b extends between the side surface S1b and the side surface S2b, and the side surface CS of the chamfered corner CC connected with the side surface S2b and the side surface S3b extends between the side surface S2b and the side surface S3b. That is to say, in the embodiments of FIG. 1, FIG. 2 and FIG. 3, the chamfered semiconductor die (i.e., the semiconductor die 120) includes six side surfaces.

Figure 5:
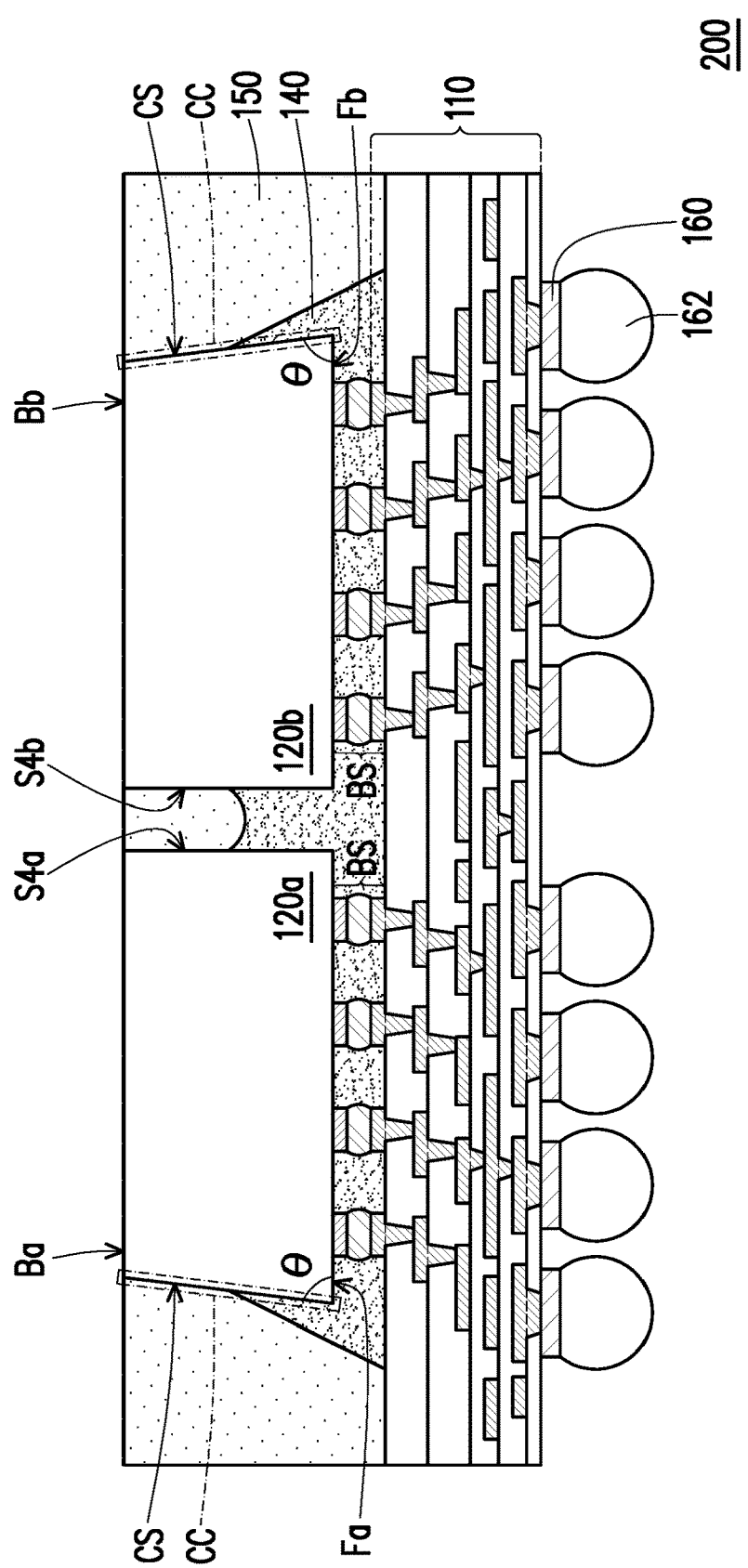
FIG. 5 is a schematic cross-sectional view of a semiconductor package in accordance with some alternative embodiments of the disclosure.

Further, as shown in FIG. 1, FIG. 2 and FIG. 3, in the semiconductor die 120a, the side surface CS extends between the back surface Ba and the front surface Fa; and in the semiconductor die 120b, the side surface CS extends between the back surface Bb and the front surface Fb. That is to say, in the semiconductor die 120, the side surface CS of the chamfered corner CC connects the back surface (e.g., the back surface Ba or the back surface Bb) at its illustrated top edge, and connects the front surface (e.g., the front surface Fa or the front surface Fb) at its illustrated bottom edge. In some embodiments, as shown in FIG. 1, the side surface CS is a vertical side surface. In detail, as shown in FIG. 1, the included angle θ between the side surface CS and the illustrated bottom surface of the semiconductor die 120 (e.g., the front surface Fa or the front surface Fb) is about 90°. However, the disclosure is not limited thereto. In some alternative embodiments, referring to FIG. 5, in the semiconductor package 200, the side surface CS is a slanted side surface. In detail, as shown in FIG. 5, the included angle θ between the side surface CS and the illustrated bottom surface of the semiconductor die 120 (e.g., the front surface Fa or the front surface Fb) is greater than or equal to 30° and less than 90°. In some embodiments, the shape of the side surface CS is quadrilateral. In certain embodiments, the quadrilateral side surface CS comprises a rectangular shape with top and bottom edges having substantially the same length. In certain alternative embodiments, the quadrilateral side surface CS comprises a trapezoidal shape with the top edge having a different length than the bottom edge. In some alternative embodiments, the shape of the side surface CS is triangular. Further, since the side surface CS of the chamfered corner CC extends between the back surface (e.g., the back surface Ba or the back surface Bb) and the front surface (e.g., the front surface Fa or the front surface Fb), the depth D of the chamfered corner CC along the direction Z is equal to the height H of the semiconductor die 120 along the direction Z.

Further, as shown in FIG. 3, from the top view, the illustrated top edge of the side surface CS is a straight line edge. That is to say, in the embodiments of FIG. 1, FIG. 2 and FIG. 3, at least one corner of the chamfered semiconductor die is chamfered to render a chamfered surface with straight line edges. Further, the corner of the semiconductor die 120 before chamfering and the corresponding straight chamfered edge after chamfering is formed a triangular shape T, as shown in FIG. 3. The triangular shape T may be any kind of triangle, such as a right triangle, an isosceles triangle, a regular triangle, or the like. The chamfered corner CC of the semiconductor die 120 means larger volume of the encapsulant 150. With such configuration, when the semiconductor package 100 is mounted onto a package substrate such as a circuit board, the thermally-induced stress caused due to coefficient of thermal expansion (CTE) mismatch between the semiconductor package 100 and the package substrate and easy to induce crack and/or delamination issue of the encapsulant 150 on corner of the semiconductor die 120 may be effectively reduced. This is because the encapsulant 150 has more extension capability to reduce stress, avoid crack and/or delamination issue and thereby enhancing the reliability of the package structure. From another point of view, as shown in FIG. 3, the offset D1 of the chamfered corner CC along the direction X parallel to the side surface S1a, S1b, S3a or S3b is greater than or equal to about 5 micrometers and less than or equal to a half of the length L1 of the semiconductor die 120 along the direction X; and the offset D2 of the chamfered corner CC along the direction Y parallel to the side surface S2a, S2b, S4a or S4b is greater than or equal to about 5 micrometers and less than or equal to a half of the length L2 of the semiconductor die 120 along the direction Y, wherein the direction X is perpendicular to the direction Y, and the direction Z is perpendicular to the direction X and the direction Y. With such configuration, when the semiconductor package 100 is mounted onto the package substrate, the thermally-induced stress caused due to CTE mismatch between the semiconductor package 100 and the package substrate and experienced by the encapsulant 150 may be effectively reduced, thereby avoiding the crack and/or delamination issue of the encapsulant 150 and enhancing the reliability of the package structure.

In some embodiments, the exterior angle between the side surface CS of the chamfered corner CC and the side surface connected with the said chamfered corner CC is greater than 0 degree and less than about 90 degree. In detail, as shown in FIG. 3, each of the exterior angle θ1 between the side surface CS and the side surface S1a, the exterior angle θ1 between the side surface CS and the side surface S3a, the exterior angle θ1 between the side surface CS and the side surface S1b, and the exterior angle θ1 between the side surface CS and the side surface S3b is greater than 0 degree and less than about 90 degree. It is noted that those skilled in the art should understand that each of the exterior angle (not labeled) between the side surface CS and the side surface S2a and the exterior angle (not labeled) between the side surface CS and the side surface S2b is also greater than 0 degree and less than about 90 degree.

As shown in FIG. 1, FIG. 2 and FIG. 3, the underfill layer 140 is in contact with a portion of the side surface CS of the chamfered corner CC. As such, the portion of the side surface CS in contact with the underfill layer 140 is spaced apart from the encapsulant 150 by the underfill layer 140. Further, the encapsulant 150 is in contact with another portion of the side surface CS of the chamfered corner CC. That is to say, in semiconductor package 100, a portion of the side surface CS of the chamfered corner CC is not in direct contact with the encapsulant 150, while another portion of the side surface CS of the chamfered corner CC is in direct contact with the encapsulant 150.

As shown in FIG. 3, the semiconductor die 120a has a corner Ci formed by the side surface S1a and the side surface S4a and a corner Ci formed by the side surface S3a and the side surface S4a; and the semiconductor die 120b has a corner Ci formed by the side surface S1b and the side surface S4b and a corner Ci formed by the side surface S3b and the side surface S4b. In detail, as shown in FIG. 3, a right angle is included between the side surface S1a and the side surface S4a, a right angle is included between the side surface S3a and the side surface S4a, a right angle is included between the side surface S1b and the side surface S4b, and a right angle is included between the side surface S3b and the side surface S4b. As such, the corners C of the semiconductor dies 120 may be referred to as sharp corners or unchamfered corners. It is noted that the term "sharp" refers to angles of 90° or less throughout the entire disclosure. On the other hand, the term "sharp corner" refers to corners having angles of 90° or less throughout the entire disclosure. However, the disclosure is not limited thereto. In some alternative embodiments, the corner Ci of the semiconductor die 120 may be a rounded corner. In certain embodiments, the corner Ci of the semiconductor die 120 is smoothened during the manufacturing process of the semiconductor die 120, for example via a laser cutting step or blade cutting step in the singulation process. The offset of the corner Ci which is rounded along the direction X is less than about 5 micrometers; and the offset of the corner Ci which is rounded along the direction Y is less than about 5 micrometers.

Further, as shown in FIG. 3, in the semiconductor die 120a, the corner Ci is formed by one outer side surface (e.g., the side surface S1a or the side surface S3a) without facing toward any other semiconductor die (e.g., the semiconductor die 120b) and one inner side surface (e.g., the side surface S4a) facing toward other semiconductor die (e.g., the semiconductor die 120b); and in the semiconductor die 120b, the corner Ci is formed by one outer side surface (e.g., the side surface S1b or the side surface S3b) without facing toward any other semiconductor die (e.g., the semiconductor die 120a) and one inner side surface (e.g., the side surface S4b) facing toward other semiconductor die (e.g., the semiconductor die 120a). As such, the corners C of the semiconductor dies 120 may be referred to as inner corners. Also, the corners C of the semiconductor die 120a face toward the corners C of the semiconductor die 120b. From another point of view, as shown in FIG. 3, the corners C of the semiconductor die 120a are spaced apart from the corners C of the semiconductor die 120b by the underfill layer 140. Further, as shown in FIG. 3, the underfill layer 140 is in contact with the corners C.

As shown in FIG. 1, FIG. 2 and FIG. 3, in the semiconductor package 100, portions of the semiconductor dies 120 are removed to render the chamfered corners CC, such that more space is provided for accommodating the encapsulant 150 encapsulating the semiconductor dies 120. That is, the chamfered corner CC of the semiconductor die 120 means larger volume of the encapsulant 150. As such, when the semiconductor package 100 is mounted onto the package substrate, additional encapsulant 150, which occupies at the regions of the outer corners of the semiconductor dies 120 before chamfering, is capable to provide buffer function to facilitate releasing the thermally-induced stress resulted from CTE mismatch between the semiconductor dies 120 and the package substrate and exerted on the encapsulant 150. Thereby, the problem of crack and/or delamination of the encapsulant 150 may be sufficiently alleviated, and the reliability of the package structure may be improved.

The method of forming the semiconductor package 100 will be described in details below with reference to FIG. 4A to FIG. 4E. FIG. 4A to FIG. 4E are schematic cross-sectional views illustrating a manufacturing process of the semiconductor package 100 in accordance with some embodiments of the disclosure. In exemplary embodiments, the following manufacturing process is part of a wafer level packaging process. In detail, one semiconductor package is shown to represent plural semiconductor packages obtained following the manufacturing process. That is to say, a single package region is illustrated in FIG. 4A to FIG. 4E, and the semiconductor package 100 (see FIG. 1) is formed in the illustrated package region.

Figure 4A:
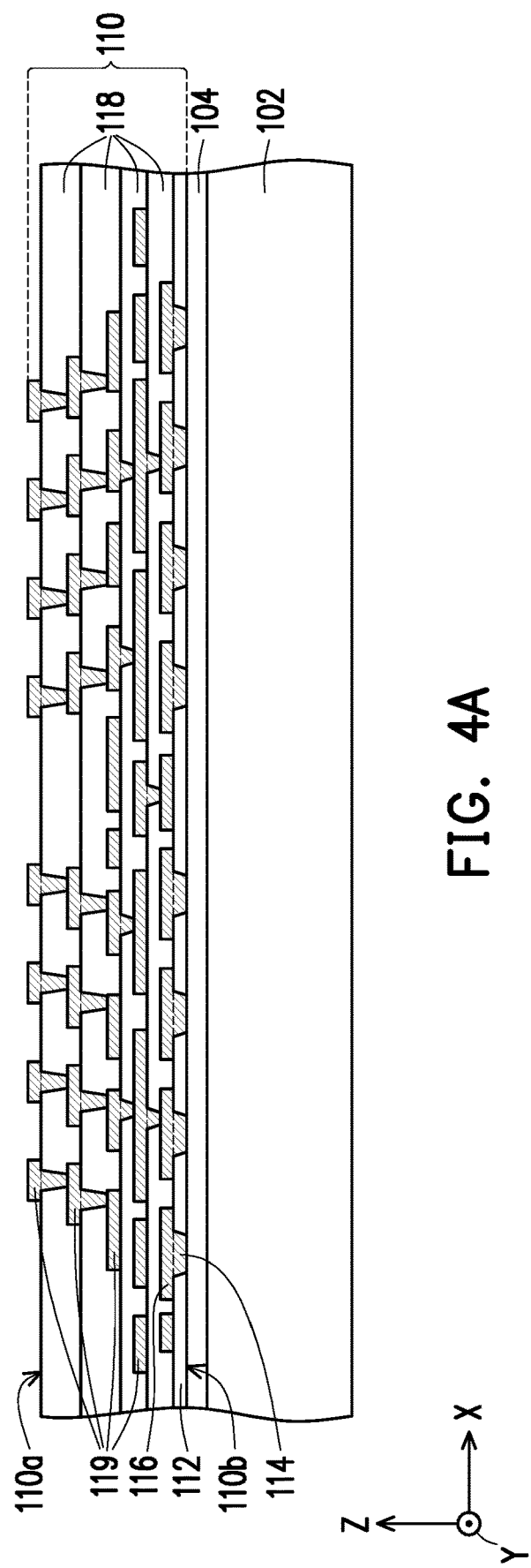
FIG. 4A to FIG. 4E are schematic cross-sectional views illustrating a manufacturing process of a semiconductor package in accordance with some embodiments of the disclosure.

Referring to FIG. 4A, a carrier 102 having a de-bonding layer 104 thereon is provided. In some embodiments, the carrier 102 is a glass substrate. However, other material may be adapted as a material of the carrier 102 as long as the material is able to withstand the subsequent processes while carrying the package structure formed thereon. In some embodiments, the de-bonding layer 104 is formed on the illustrated top surface of the carrier 102, as shown in FIG. 4A. For example, the de-bonding layer 104 is a light-to-heat conversion (LTHC) release layer formed on the top surface of the glass substrate. However, the disclosure is not limited thereto, and other suitable materials may be adapted for the de-bonding layer 104. In detail, the de-bonding layer 104 may allow the structure formed on the carrier 102 in the subsequent processes to be peeled off from the carrier 102. In some alternative embodiments, a buffer layer (not shown) is coated on the de-bonding layer 104, where the de-bonding layer 104 is sandwiched between the buffer layer and the carrier 102, and a top surface of the buffer layer further provides a high degree of coplanarity. The buffer layer may be a dielectric material layer or a polymer layer which is made of polyimide, benzocyclobutene (BCB), polybenzoxazole (PBO), or any other suitable polymer-based dielectric material.

Then, the interposer 110 is formed over the carrier 102 and the de-bonding layer 104. The interposer 110 has a first surface 110a and a second surface 110b opposite to the first surface 110a. In some embodiments, the second surface 110b faces the carrier 102. In some embodiments, the second surface 110b is attached to the de-bonding layer 104.

In some embodiments, the formation of the interposer 110 includes first forming a passivation layer 112 on the de-bonding layer 104. The material of the passivation layer 112 may include periodic mesoporous organosilica (PMO), low temperature polyimide (LTPI), polyimide derivative, PBO, or any other suitable dielectric material. The passivation layer 112 may be formed by spin-on coating, chemical vapor deposition (CVD), plasma-enhanced chemical vapor deposition (PECVD), or the like. The passivation layer 112 is a single layer or multiple layers. After forming the passivation layer 112, a plurality of conductive vias 114 are formed in the passivation layer 112, and a plurality of conductive patterns 116 are formed on the conductive vias 114 to electrically connect to the conductive vias 114 respectively. In some embodiments, a plurality of openings (not shown) are formed in the passivation layer 112, and the conductive vias 114 are formed in the openings. The conductive patterns 116 are then formed on the conductive vias 114 respectively. In some embodiments, the conductive vias 114 and the conductive patterns 116 are formed integrally by a dual damascene process. In some alternative embodiments, the conductive vias 114 and the conductive patterns 116 are formed separately by a single damascene process or any other suitable process. In some embodiments, as shown in FIG. 4A, the illustrated bottom surface of the passivation layer 112 and the illustrated bottom surfaces of the conductive vias 114 are collectively referred to as the second surface 110b of the interposer 110. The conductive vias 114 and the conductive patterns 116 may each include a diffusion barrier layer and a conductive material thereon. The diffusion barrier layer may include one or more layers of TaN, Ta, TiN, Ti, CoW, or the like and be formed by atomic layer deposition (ALD), or the like, and the conductive material may include copper, aluminum, tungsten, silver, combinations thereof, or the like and be formed by CVD, physical vapor deposition (PVD), a plating process, or the like. The number of the conductive vias 114 and the number of the conductive patterns 116 are not limited in the disclosure, and may be more than or less than what is depicted in FIG. 4A, and may be designated based on demand and/or design layout.

After forming the conductive patterns 116, a plurality of dielectric layers 118 and a plurality of conductive layers 119 are alternately formed over the conductive patterns 116, to complete the formation of the interposer 110. In some embodiments, as shown in FIG. 4A, the dielectric layers 118 and the conductive layers 119 are sequentially formed in alternation along the direction Z parallel with the normal direction of the carrier 102. In detail, as shown in FIG. 4A, the conductive layers 119 are sandwiched between the dielectric layers 118, but the illustrated top surface of the topmost layer of the conductive layers 119 is exposed by the topmost layer of the dielectric layers 118, and the bottommost layer of the conductive layers 119 is exposed by the bottommost layer of the dielectric layers 118. The exposed topmost layer of the conductive layers 119 functions to serve the purpose of electrical connection with the semiconductor dies 120. In some embodiments, the exposed topmost layer of the conductive layers 119 includes a plurality of connector structures for connecting with the semiconductor dies 120. In some embodiments, the connector structures in the exposed topmost layer of the conductive layers 119 include a plurality of under-bump metallurgy patterns. In some embodiments, the connector structures in the exposed topmost layer of the conductive layers 119 include a plurality of pads. The foregoing pads may include redistribution pads (routing pads) and/or bump pads. In some embodiments, the connector structures in the exposed topmost layer of the conductive layers 119 include a plurality of micro-bumps.

It should be noted that although four conductive layers 119 and four dielectric layers 118 are illustrated in FIG. 4A, the number of these layers is not limited in this disclosure. In some alternative embodiments, the interposer 110 may be constituted by more or less layers of the conductive layer 119 and the dielectric layer 118 depending on the circuit design.

In some embodiments, the material of the conductive layer 119 includes aluminum, titanium, copper, nickel, tungsten, and/or alloys thereof. The conductive layers 119 may include a diffusion barrier layer and a conductive material thereon. The diffusion barrier layer may include one or more layers of TaN, Ta, TiN, Ti, CoW, or the like and be formed by ALD, or the like, and the conductive material may include copper, aluminum, tungsten, silver, combinations thereof, or the like and be formed by CVD, PVD, a plating process, or the like. The conductive layers 119 may include vias and/or traces. The conductive layers 119 may be formed in/on the dielectric layers 118. The conductive layer 119 may be formed by, for example, electroplating, deposition, and/or photolithography and etching. In some embodiments, the material of the dielectric layer 118 includes an organic material, such as polyimide, epoxy resin, acrylic resin, phenol resin, BCB, PBO, or any other suitable polymer-based dielectric material. The dielectric layer 118 may be formed by suitable fabrication techniques such as spin-on coating, CVD, PECVD or the like. In some embodiments, the interposer 110 is a silicon-free substrate. In some embodiments, the interposer 110 is referred to an "organic interposer". The organic interposer is beneficial to reduce the total process cost of the package structure since the organic interposer is a low-cost interposer. In some embodiments, the critical dimension (e.g., line width or space width) of the organic interposer is closer to the critical dimension of at least one of the semiconductor chips.

In some embodiments, the interposer 110 is a passive interposer, which is used to convey a lack of a functional device or integrated circuit device. Such passive interposer is referred to as a "device-free interposer" in some examples. In other embodiments, the interposer 110 is an active interposer that contains at least one functional device or integrated circuit device embedded in the dielectric layers 118 and electrically connected to the conductive layers 119. Such active interposer is referred to as a "device-containing interposer" in some examples. In some embodiments, the functional device includes an integrated active device, an integrated passive device, or a combination thereof. The integrated active device may include a logic device, a memory device, a MOSFET device, a CMOS device, a BJT device, a SoC, the like, or a combination thereof. The integrated passive device may include a resistor, a capacitor, an inductor, a resonator, a filter, the like, or a combination thereof.

Figure 4B:
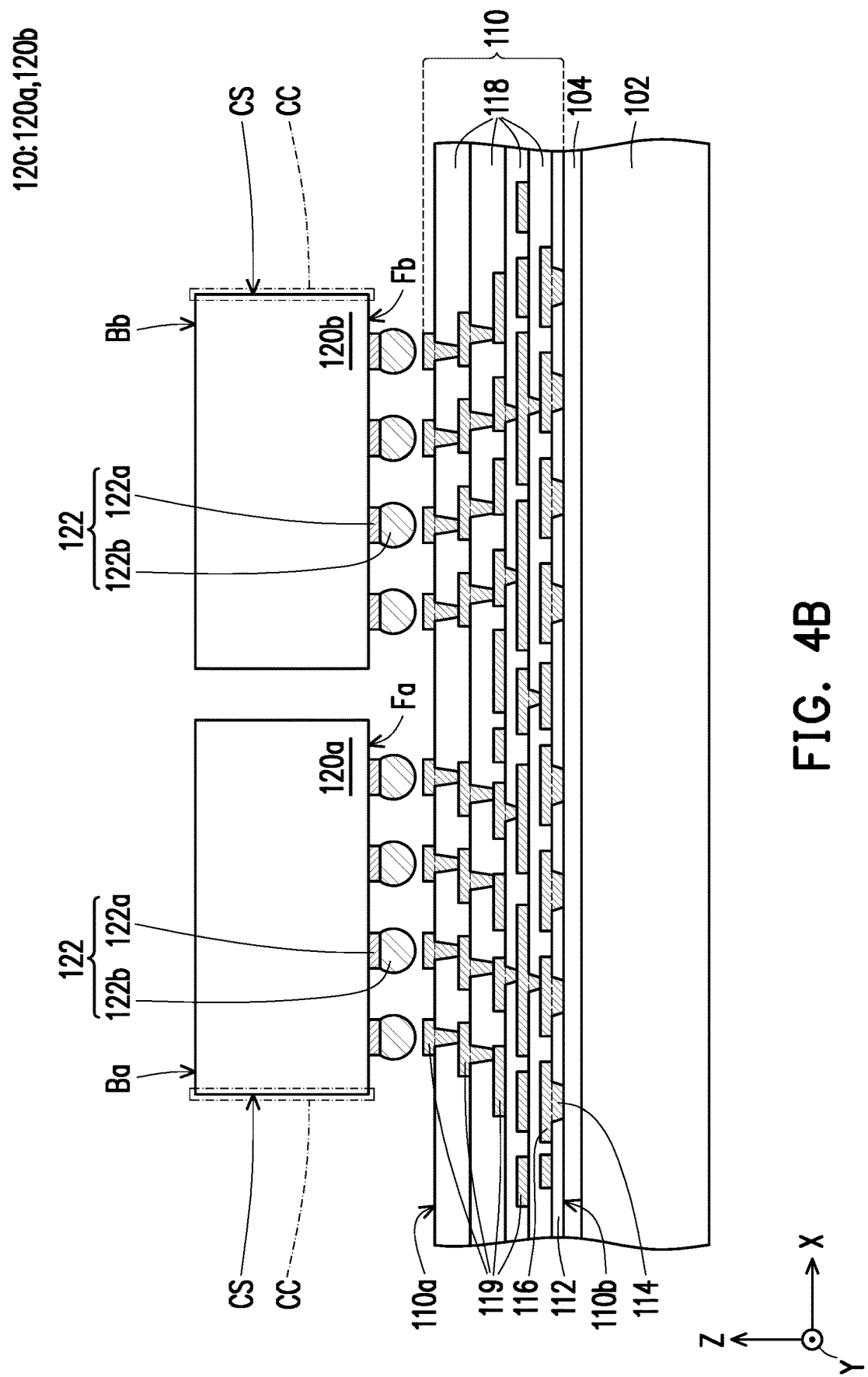

Referring to FIG. 4B, at least one semiconductor die 120 including the semiconductor die 120a and the semiconductor die 120b is provided over the first surface 110a of the interposer 110. In detail, as shown in FIG. 4B, the front surface of the semiconductor die 120 (e.g., the front surface Fa of the semiconductor die 120a or the front surface Fb of the semiconductor die 120b) faces toward the first surface 110a of the interposer 110. Further, as shown in FIG. 4B, each semiconductor die 120 includes a plurality of connector structures 122 disposed at the front surface. In some embodiments, the front surface of the semiconductor die 120 is referred to as an active surface. In some embodiments, the connector structure 122 is a micro-bump containing a conductive connector 122a and a solder cap 122b on the conductive connector 122a. However, the disclosure is not limited thereto. In some alternative embodiments, the connector structure 122 may be other conductive structure, such as solder bump, gold bump or copper bump. In some embodiments, the conductive connector 122a is a copper pillar, a copper post, a copper pad, or the like. As shown in FIG. 4B, although four connector structures 122 are presented for illustrative purposes, those skilled in the art can understand that the number of the connector structures 122 may be more than or less than what is depicted in FIG. 4B, and may be designated based on demand and/or design layout. From another point of view, although four connector structures 122 arranged as in a row is shown for simplicity in FIG. 4B, the disclosure is not limited by the embodiments or figures shown herein, and those skilled in the art can understand that more than one connector structure 122 arranged in an array are provided at the front surface of the semiconductor die 120.

In some embodiments, the formation of the semiconductor die 120 includes the following steps. First, the semiconductor die 120 is formed in a semiconductor wafer (not shown). For example, the semiconductor wafer is processed to include multiple device regions, and then after formation, the semiconductor wafer may be tested. For example, each device region of the semiconductor wafer is probed and tested for functionality and performance, and the known good devices are selected and used for subsequently processing. In some embodiments, the semiconductor wafer is attached to a temporary carrier or a frame including an adhesive tape (not shown), and then the semiconductor wafer is singulated along scribe lines (not shown) to form individual semiconductor dies 120. In some embodiments, the back surface of the semiconductor die 120 (e.g., the back surface Ba of the semiconductor die 120a or the back surface Bb of the semiconductor die 120b) is attached to the temporary carrier or the frame including an adhesive tape. The singulation process may be a blade cutting process or a laser cutting process. In embodiments where the semiconductor die 120a and the semiconductor die 120b are formed in the same semiconductor wafer, the semiconductor die 120a and the semiconductor die 120b are formed through the same singulation process. In embodiments where the semiconductor die 120a and the semiconductor die 120b are formed in different semiconductor wafers, the semiconductor die 120a and the semiconductor die 120b are formed through separate and independent singulation processes.

After the semiconductor wafer is singulated apart into individual semiconductor dies 120, a chamfering process is performed on the semiconductor dies 120 to form the chamfered corners CC (e.g., the chamfered corner CC connected with the side surface S1a and the side surface S2a and the chamfered corner CC connected with the side surface S2a and the side surface S3a in the semiconductor die 120a, and/or the chamfered corner CC connected with the side surface S1b and the side surface S2b and the chamfered corner CC connected with the side surface S2b and the side surface S3b in the semiconductor die 120b, as shown in FIG. 3). In some embodiments, during the chamfering process, the semiconductor dies 120 are still attached to the temporary carrier or the frame including an adhesive tape via the back surfaces thereof. In some embodiments, the chamfering process is a laser cutting process. In some embodiments, the laser used in the laser cutting process of the chamfering process has a wavelength in a range of about 490 nm to about 570 nm. In some embodiments, the laser used in the laser cutting process of the chamfering process has a power in a range of about 10 W to about 20 W and an activation time of about 3 seconds to about 30 seconds. In some embodiments, the semiconductor die 120a and the semiconductor die 120b are formed through the same chamfering process. In some alternative embodiments, the semiconductor die 120a and the semiconductor die 120b are formed through separate and independent chamfering processes. In other embodiments, the chamfering process may be a blade cutting process.

Continue referring to FIG. 4B, an aligning process is performed, such that the connector structures 122 of each semiconductor die 120 respectively are substantially aligned to the connector structures (such as pads, under-bump metallurgy patterns or bumps) in the exposed topmost layer of the conductive layers 119. In detail, as shown in FIG. 4B, each of the connector structures 122 of each semiconductor die 120 is substantially aligned to one of the connector structures of the exposed topmost layer of the conductive layers 119 in a one-to-one relationship. Further, after the aligning process is performed, the semiconductor dies 120 are configured to be located at the positions ready for the subsequently bonding process.

Figure 4C:
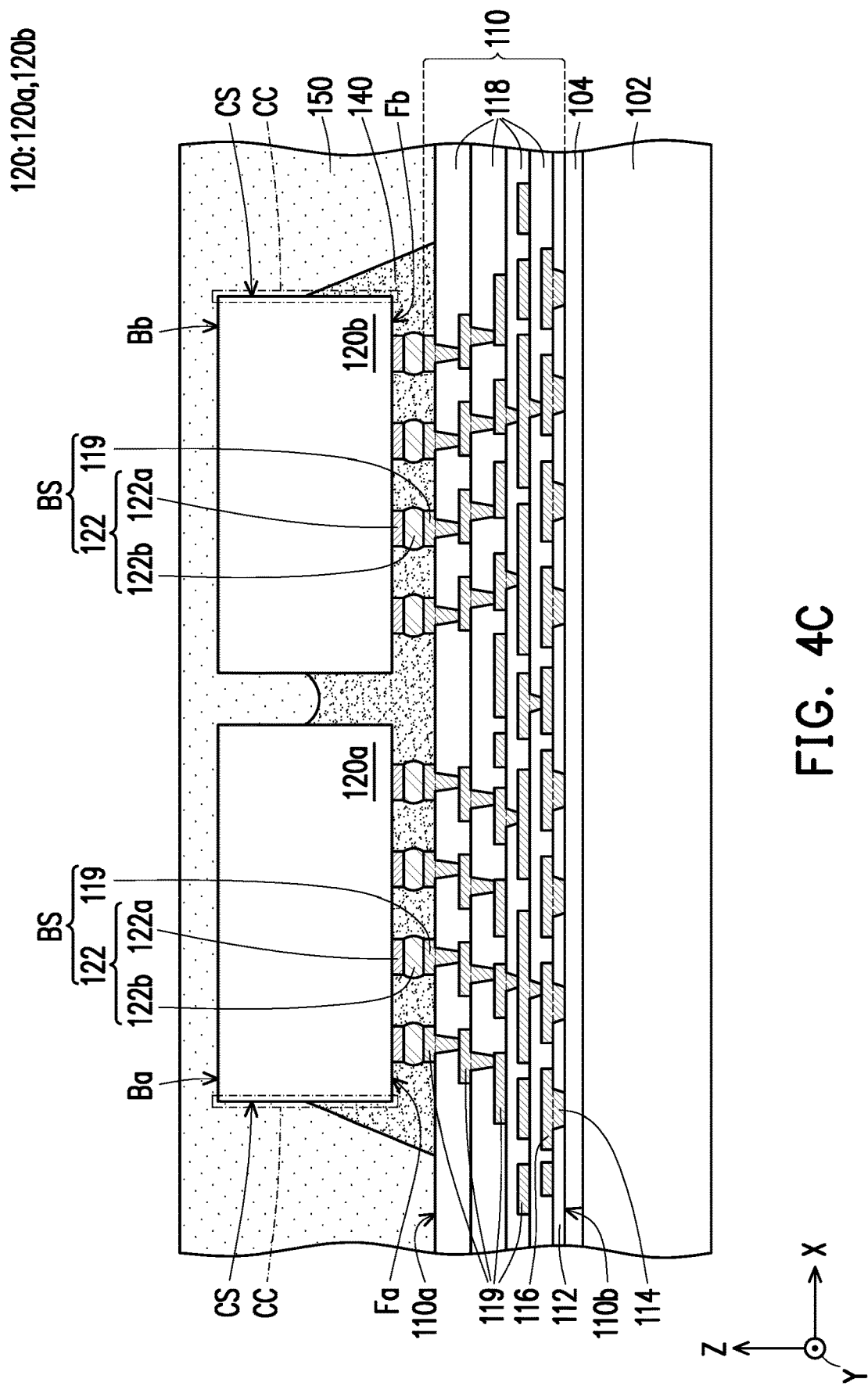

Referring to FIG. 4C, a bonding process is performed to mount the semiconductor dies 120 onto the interposer 110. In detail, as shown in FIG. 4C, the connector structures 122 of the semiconductor die 120 are bonded to the corresponding connector structures of the exposed topmost layer of the conductive layers 119 to form the bonding structures BS. In some embodiments, the bonding process is a flip-chip bonding process. In some embodiments, the semiconductor die 120 is bonded on the interposer 110 through a reflow process, or other suitable processes. In some embodiments, a solder flux (not shown) may be applied onto the connector structures 122 for better adhesion.

Referring to FIG. 4A to FIG. 4C, the interposer 110 is formed prior to the placement of the semiconductor dies 120, and thus the foregoing process may be considered as a "RDL first method." By adopting the RDL first method to form the interposer 110 and the semiconductor dies 120 over the carrier 102, the subsequently formed semiconductor package 100 can be formed without being constrained by the fan-out ratio (i.e., the ratio of die area to package area). Moreover, since the semiconductor dies 120 are coupled to the first surface 110a of the interposer 110 through flip-chip bonding, a die attach film (DAF) or a film on wire (FOW) utilized in conventional package structures for adhering the semiconductor devices is eliminated. As a result, an overall thickness of the subsequently formed semiconductor package 100 may be effectively reduced.

Continued on FIG. 4C, after the semiconductor dies 120 are connected with the interposer 110, the underfill layer 140 is formed between the semiconductor dies 120 and the interposer 110, surrounding the bonding structures BS. In detail, as shown in FIG. 4C, after underfill layer 140 is formed over the interposer 110, the underfill layer 140 is in direct contact with a portion of the side surface CS of the chamfered corner CC. The underfill layer 140 may be formed by a capillary flow process after the semiconductor dies 120 are attached, or may be formed by a suitable deposition method before the semiconductor dies 120 are attached. In some embodiments, the underfill layer 140 includes polymer such as epoxy.

After forming the underfill layer 140, the encapsulant 150 is formed over the interposer 110 to encapsulate the semiconductor dies 120 and the underfill layer 140. During this stage, the semiconductor dies 120 are fully encapsulated by the encapsulant 150, without exposing the back surfaces of the semiconductor dies 120 (e.g., the back surface Ba of the semiconductor die 120a and the back surface Bb of the semiconductor die 120b). That is to say, at this stage, the semiconductor dies 120 are not revealed and are well protected by the encapsulant 150. In some embodiments, the encapsulant 150 is a molding compound formed by an over-molding process. In some alternative embodiments, the material of the encapsulant 150 includes epoxy resins or other suitable resins.

Figure 4D:
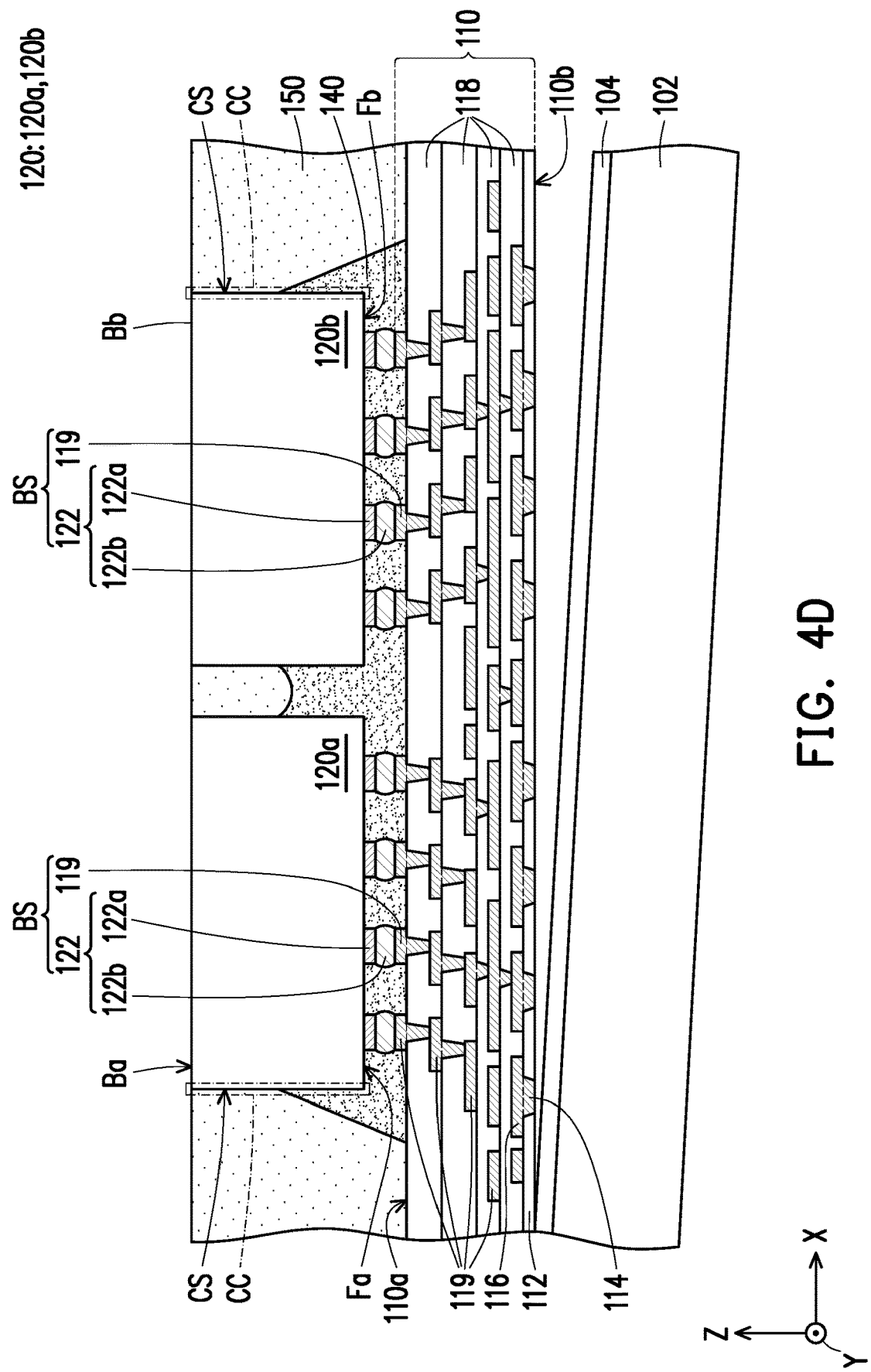

Referring to FIG. 4C and FIG. 4D, the encapsulant 150 is planarized until the back surface Ba of the semiconductor die 120a and the back surface Bb of the semiconductor die 120b are exposed. In some embodiments, as shown in FIG. 4D, after the planarization process, the illustrated top surface of the encapsulant 150 is substantially coplanar with the back surface Ba of the semiconductor die 120a and the back surface Bb of the semiconductor die 120b. The encapsulant 150 may be planarized through a grinding process or a chemical mechanical polishing (CMP) process, for example. After the planarization or the grinding process, a cleaning step may be optionally performed to remove the residues generated. However, the disclosure is not limited thereto and the planarization process may be performed through any other suitable method.

After the encapsulant 150 is planarized to reveal the semiconductor dies 120, the interposer 110 is separated from the carrier 102 such that the second surface 110b of the interposer 110 is exposed. In detail, as shown in FIG. 4D, the conductive vias 114 for connecting with the later-formed conductive terminals 162 is exposed. In some embodiments, the de-bonding layer 104 is a LTHC release layer. Upon irradiation with an UV laser, the de-bonding layer 104 and the carrier 102 may be peeled off and removed from the overlying structure. It should be noted that the de-bonding process is not limited thereto. Other suitable methods may be used in some alternative embodiments. In some embodiments, before the carrier 102 is removed, a frame tape (not shown) is attached to the back surface Ba of the semiconductor die 120a and the back surface Bb of the semiconductor die 120b.

Figure 4E:
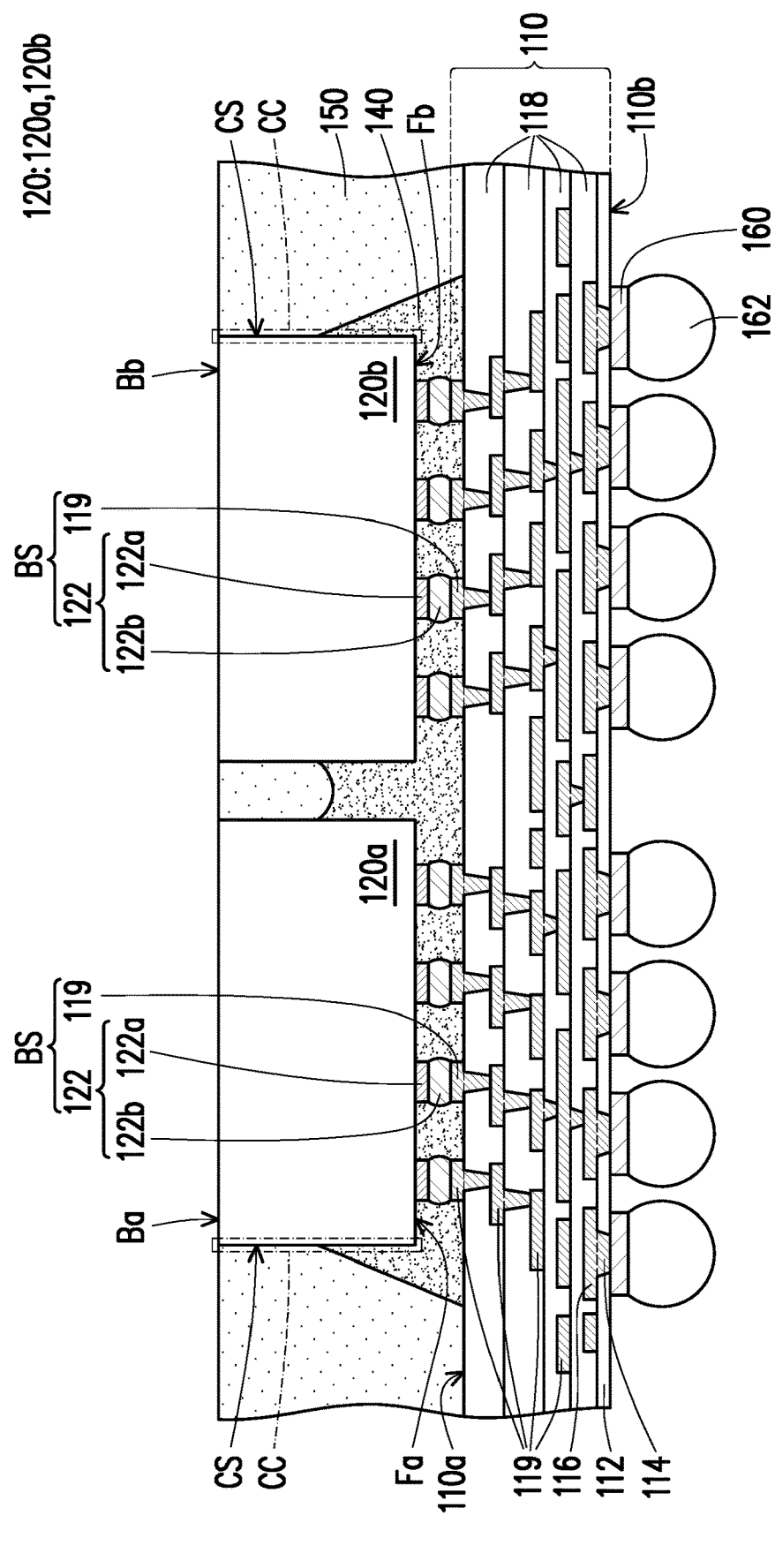

Referring to FIG. 4E, the UBM patterns 160 and the conductive terminals 162 are sequentially formed on and electrically connected with the exposed conductive vias 114. The UBM patterns 160 may be formed for ball mount. In some embodiments, the material of the UBM patterns 160 includes aluminum, copper, nickel, or an alloy thereof. After the UBM patterns 160 are formed, the conductive terminals 162 are placed on the UBM patterns 160. In some embodiments, the conductive terminals 162 are controlled collapse chip connection (C4) bumps. The conductive terminals 162 may include a conductive material such as solder, copper, aluminum, gold, nickel, silver, palladium, tin, the like, or combinations thereof. In some embodiments, the electrical terminals 162 are formed by initially forming a layer of solder through evaporation, electroplating, printing, solder transfer, ball placement, or the like. Once the layer of solder has been formed on the structure, a reflow process may be performed in order to shape the material into the desired bump shapes. In another embodiment, the electrical terminals 162 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, after the UBM patterns 160 and the electrical terminals 162 are formed, the frame tape (not shown) remains attached on the back surface Ba of the semiconductor die 120a and the back surface Bb of the semiconductor die 120b. However, the disclosure is not limited thereto. In some alternative embodiments, after the UBM patterns 160 and the electrical terminals 162 are formed, the frame tape (not shown) is separated from the semiconductor dies 120.

After the formation of the electrical terminals 160, a singulation process is performed along scribe line regions between the adjacent package regions to cut the whole structure shown in FIG. 4E into a plurality of semiconductor packages 100. As mentioned, the manufacturing process described above is part of a wafer level packaging process, although one singulated semiconductor package 100 is shown in FIG. 1, those skilled in the art should understand that plural semiconductor packages 100 are obtained after the singulation process. In some embodiments, the singulation process is performed to cut through the interposer 110 and the encapsulant 150, as shown in FIG. 4E and FIG. 1. The singulation process may be a blade cutting process or a laser cutting process. In some embodiments, the frame tape (not shown) attached on the back surface Ba of the semiconductor die 120a and the back surface Bb of the semiconductor die 120b is removed after the singulation process. In a subsequent process, the singulated semiconductor package 100 may, for example, be disposed onto a package substrate or onto other components based on requirements.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the semiconductor package 100 illustrated in FIG. 1 and FIG. 3, the chamfered corner CC includes one side surface CS. However, the disclosure is not limited thereto. In some alternative embodiments, the chamfered corner CC may include at least two side surfaces. Also, in the semiconductor package 100 illustrated in FIG. 3, the region enclosed by the side surface CS, a virtual plane extending along the side surface S1a, and a virtual plane extending along the side surface S2a is triangular (i.e., the triangular shape T). However, the disclosure is not limited thereto. Depending on the number of the side surfaces included in the chamfered corner CC, the region enclosed by the side surfaces included in the chamfered corner CC, a virtual plane extending along the side surface S1a, and a virtual plane extending along the side surface S2a may take other shapes from the top view. Hereinafter, other embodiments will be described with reference to FIG. 6 to FIG. 13.

Figure 6:
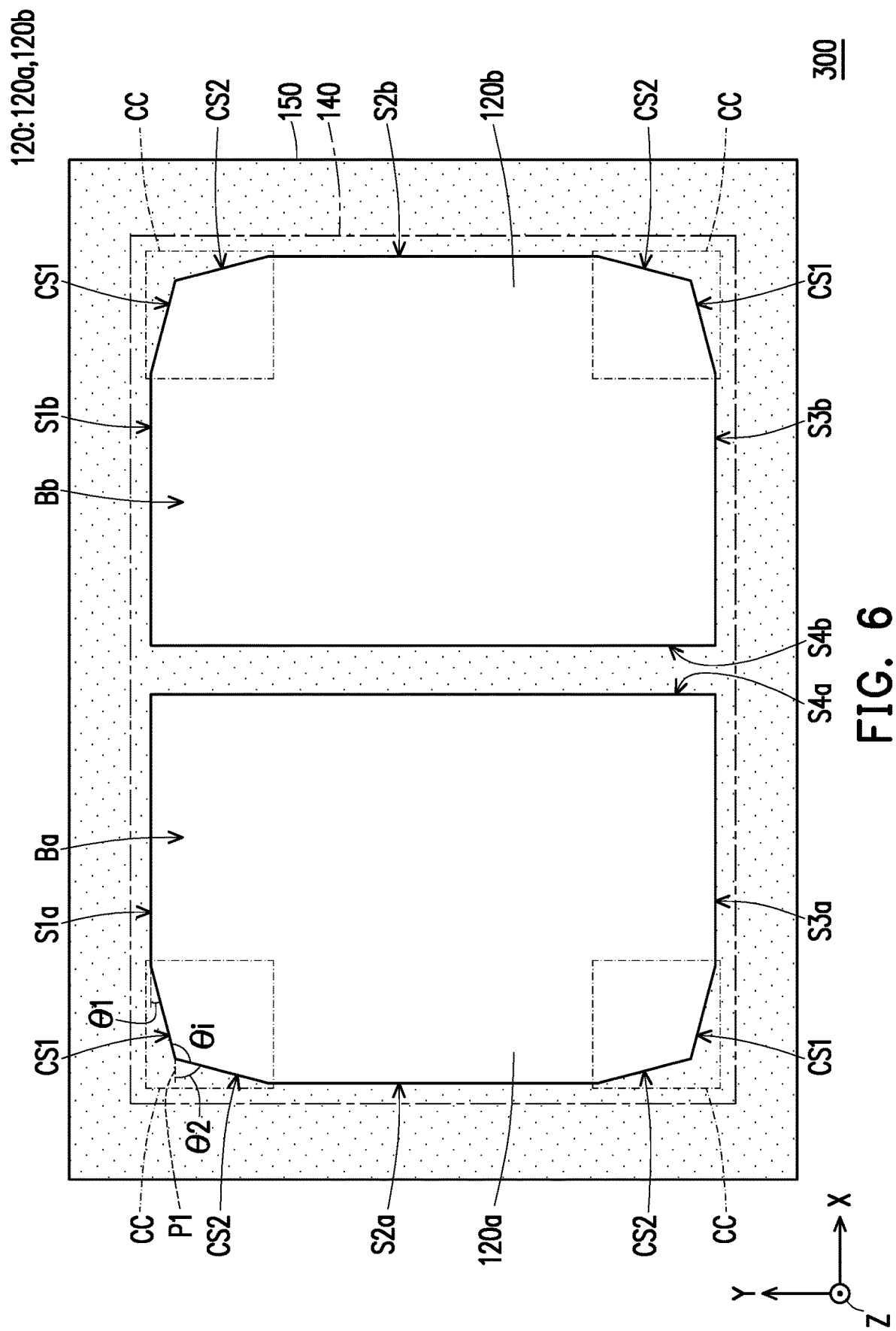
FIG. 6 is a simplified top view of a semiconductor package in accordance with some alternative embodiments of the disclosure.

FIG. 6 is a simplified top view of a semiconductor package in accordance with some alternative embodiments of the disclosure. The semiconductor package 300 illustrated in FIG. 6 is similar to the semiconductor package 100 illustrated in FIG. 3, hence the same reference numerals are used to refer to the same or liked parts, and its detailed description will be omitted herein. The differences between the semiconductor package 300 and the semiconductor package 100 will be described below.

Referring to FIG. 6, in the semiconductor package 300, each chamfered corner CC of the semiconductor dies 120 includes a side surface CS1 and a side surface CS2. That is to say, in the semiconductor package 300, the chamfered corner CC of the semiconductor die 120 includes two side surfaces. In other words, in the semiconductor package 300, the semiconductor die 120 includes eight side surfaces. In detail, as shown in FIG. 5, from the top view, in the semiconductor die 120a, the side surface CS1 extends between the side surface S1a and the side surface CS2, and the side surface CS2 extends between the side surface CS1 and the side surface S2a. Further, as shown in FIG. 6, from the top view, the illustrated top edge of the side surface CS1 and the illustrated top edge of the side surface CS2 are straight line edges. That is to say, in the embodiments of FIG. 6, at least one corner of the chamfered semiconductor die is chamfered to render two chamfered surfaces with straight line edges. In some embodiments, the exterior angle between the side surface CS1 or CS2 of the chamfered corner CC and the side surface connected with the said chamfered corner CC is greater than 0 degree and less than about 90 degree. In detail, as shown in FIG. 6, the exterior angle θ1 between the side surface CS1 and the side surface S1a is greater than 0 degree and less than about 90 degree, and the exterior angle θ2 between the side surface CS2 and a virtual plane P1 paralleled with the side surface S1a along the direction X is greater than 0 degree and less than about 90 degree. In the embodiments of FIG. 6, the exterior angle θ1 is different from the exterior angle θ2. Further, in the embodiments of FIG. 6, the exterior angle θ1 is less than the exterior angle θ2. With such configuration, the corners of the semiconductor dies 120 in the semiconductor package 300 are chamfered with convex edges. In certain embodiments, the exterior angle θ1 between the side surface CS1 and the side surface S1a is greater than 0 degree and less than about 45 degree, and the exterior angle θ2 between the side surface CS2 and a virtual plane P1 paralleled with the side surface S1a along the direction X is greater than 45 degree and less than about 90 degree. From another point of view, in some embodiments, the side surface CS1 and the side surface CS2 form an obtuse angle. As shown in FIG. 6, the included angle θi between the side surface CS1 and the side surface CS2 is an obtuse angle. In some embodiments, the included angle θi ranges from greater than 90° to less than 180°.

Although only take the chamfered corner CC connected with the side surface S1a and the side surface S2a as example for illustration, according to the descriptions with respect to FIG. 1-2 and FIG. 6 above, those skilled in the art should understand the details or descriptions (e.g. the positioning configurations) of the side surface CS1 and the side surface CS2 of the chamfered corner CC connected with the side surface S2a and the side surface S3a, the side surface CS1 and the side surface CS2 of the chamfered corner CC connected with the side surface S1b and the side surface S2b, and the side surface CS1 and the side surface CS2 of the chamfered corner CC connected with the side surface S2b and the side surface S3b.

Figure 7:
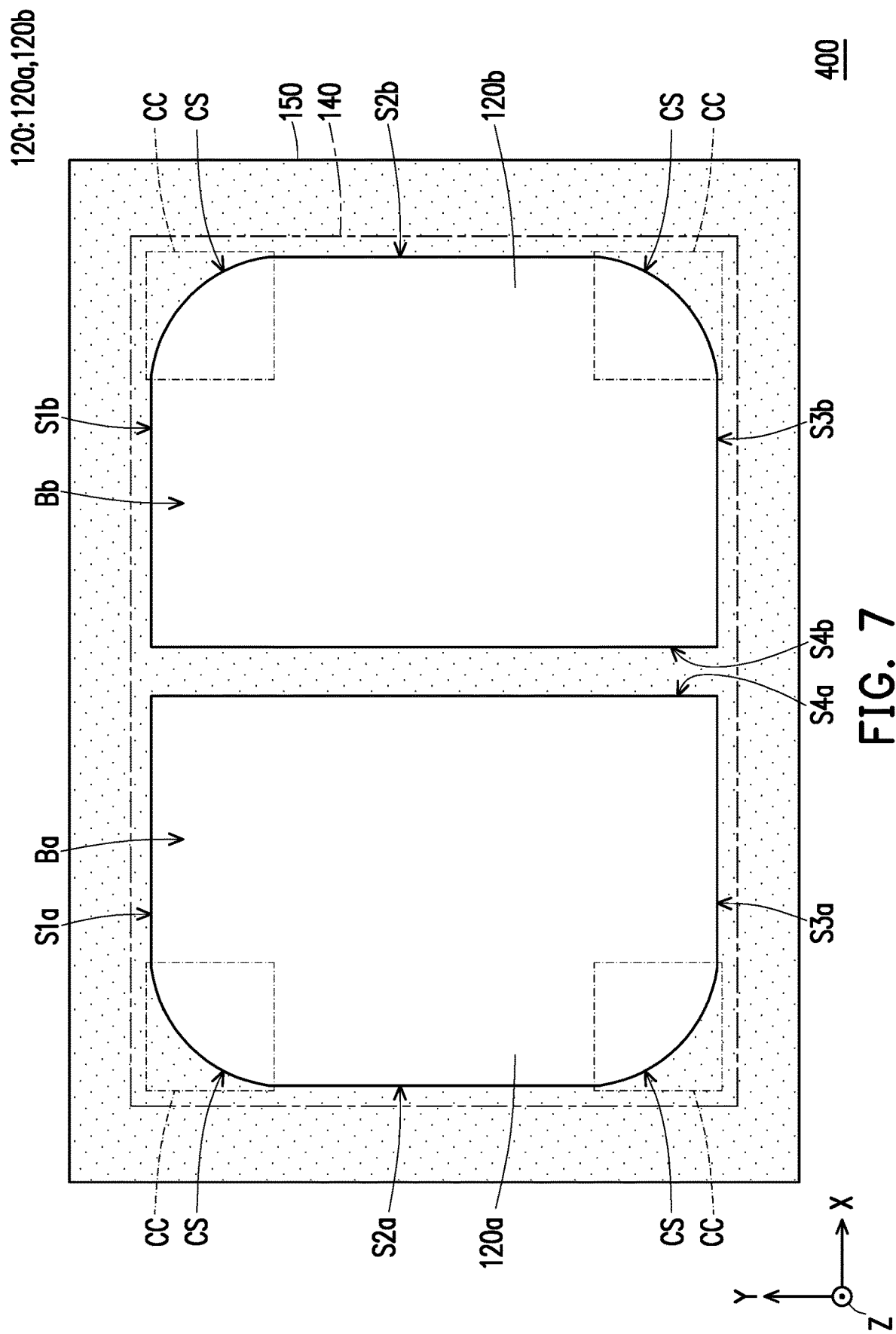
FIG. 7 is a simplified top view of a semiconductor package in accordance with some alternative embodiments of the disclosure.

FIG. 7 is a simplified top view of a semiconductor package in accordance with some alternative embodiments of the disclosure. The semiconductor package 400 illustrated in FIG. 7 is similar to the semiconductor package 100 illustrated in FIG. 3, hence the same reference numerals are used to refer to the same or liked parts, and its detailed description will be omitted herein. The difference between the semiconductor package 400 in FIG. 7 and the semiconductor package 100 in FIG. 3 lies in that the side surface CS of the chamfered corner CC is a curved side surface. In detail as shown in FIG. 7, from the top view, the illustrated top edge of the side surface CS is a curve line edge. For example, when the number of the side surfaces included in the chamfered corner CC is infinite, the side surfaces connected with the side surface S1a and the side surface S2a, the side surfaces connected with the side surface S2a and the side surface S3a, the side surfaces connected with the side surface S1b and the side surface S2b, and the side surfaces connected with the side surface S2b and the side surface S3b each may be collectively referred to as the side surface CS with curvature. In some embodiments, the side surface CS has a convexly-curved profile.

Figure 8:
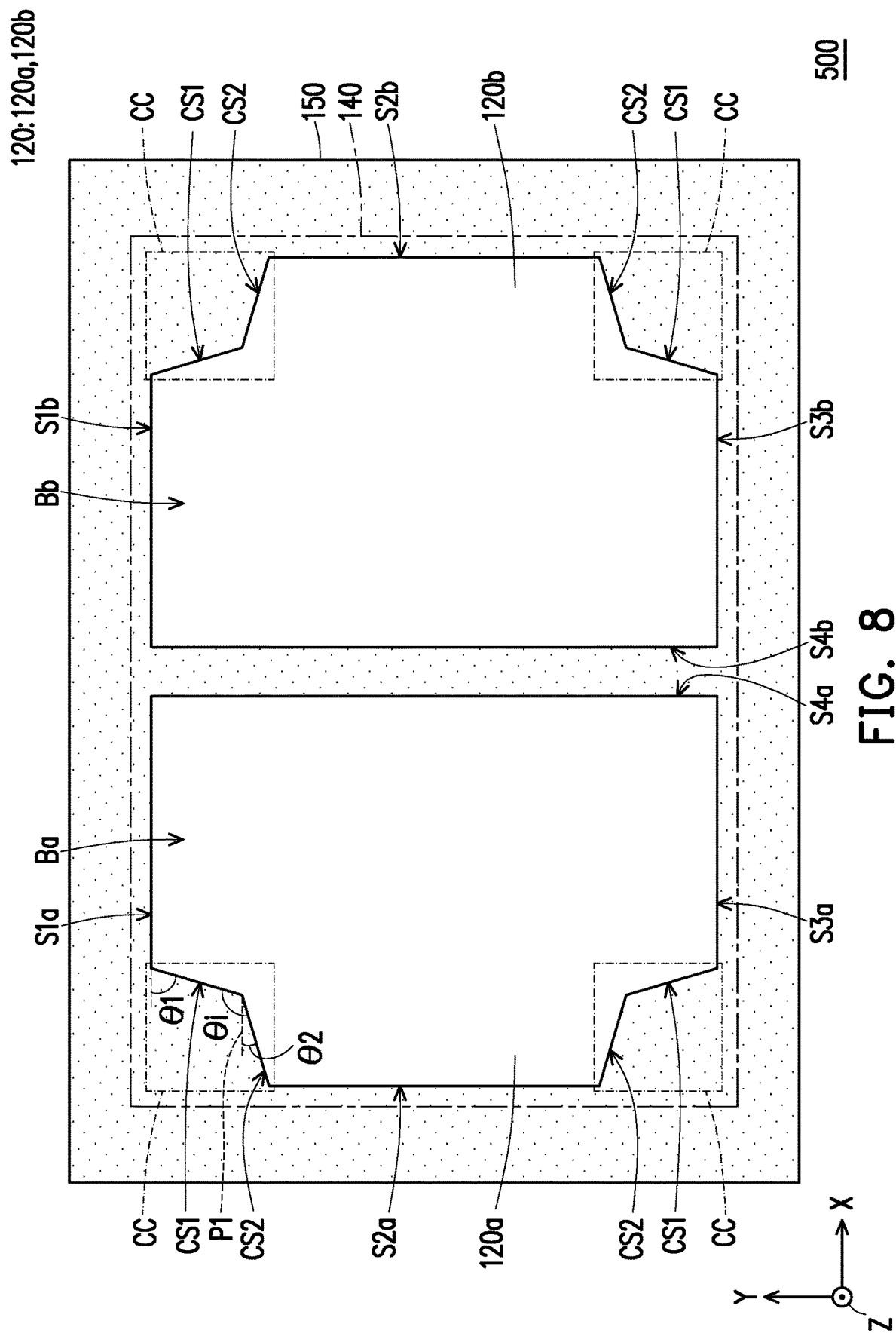
FIG. 8 is a simplified top view of a semiconductor package in accordance with some alternative embodiments of the disclosure.

FIG. 8 is a simplified top view of a semiconductor package in accordance with some alternative embodiments of the disclosure. The semiconductor package 500 illustrated in FIG. 8 is similar to the semiconductor package 300 illustrated in FIG. 6, hence the same reference numerals are used to refer to the same or liked parts, and its detailed description will be omitted herein. The difference between the semiconductor package 500 in FIG. 8 and the semiconductor package 300 in FIG. 6 lies in that the exterior angle θ1 between the side surface CS1 and the side surface S1a is greater than the exterior angle θ2 between the side surface CS2 and the virtual plane P1 paralleled with the side surface S1a. With such configuration, as shown in FIG. 8, the corners of the semiconductor dies 120 in the semiconductor package 500 are chamfered with concave edges. In certain embodiments, the exterior angle θ1 between the side surface CS1 and the side surface S1a is greater than 45 degree and less than about 90 degree, and the exterior angle θ2 between the side surface CS2 and the virtual plane P1 paralleled with the side surface S1a along the direction X is greater than 0 degree and less than about 45 degree. From another point of view, in some embodiments, the side surface CS1 and the side surface CS2 form an obtuse angle. As shown in FIG. 8, the included angle θ1 between the side surface CS1 and the side surface CS2 is an obtuse angle. In some embodiments, the included angle θ1 ranges from greater than 90° to less than 180°.

Figure 9:
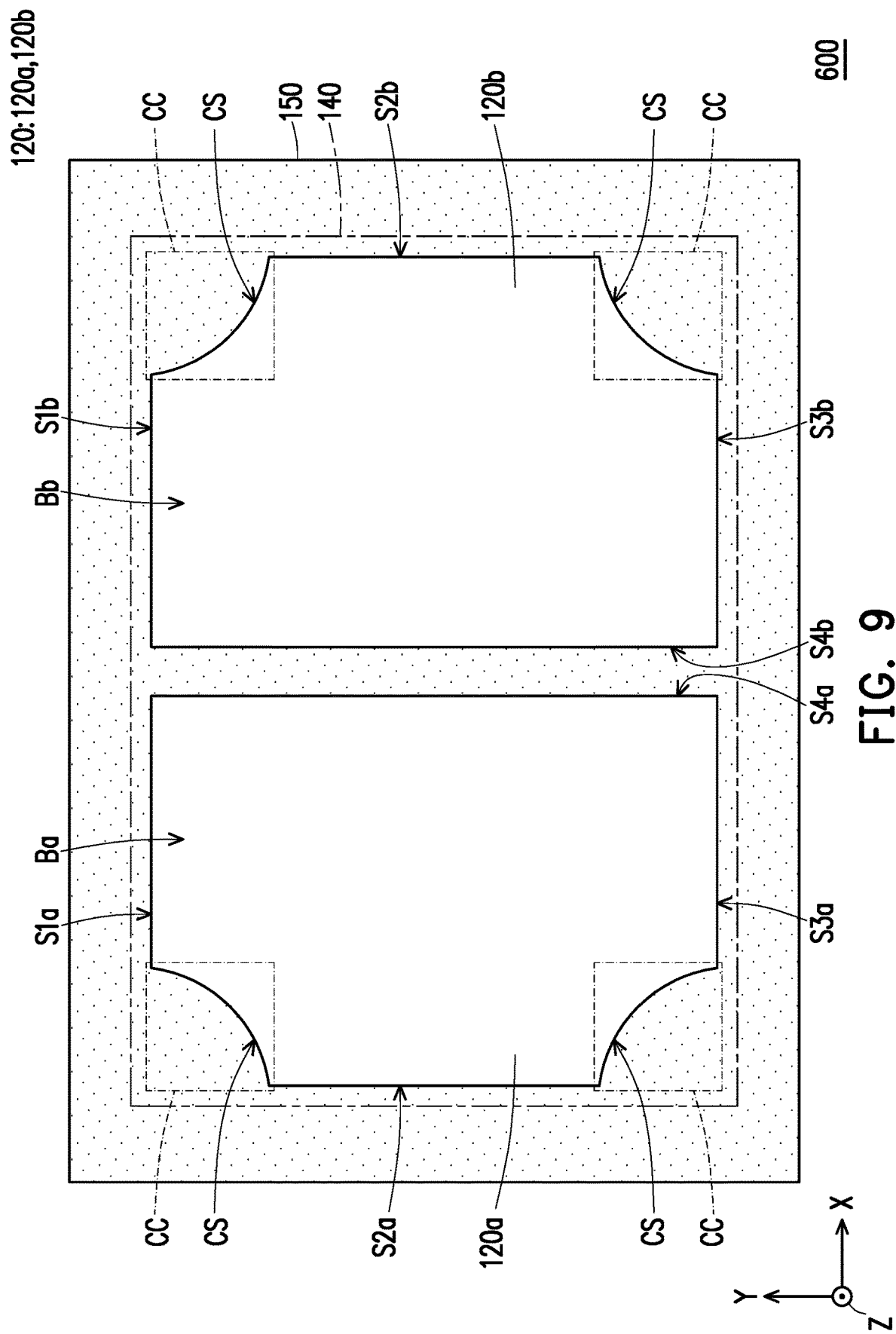
FIG. 9 is a simplified top view of a semiconductor package in accordance with some alternative embodiments of the disclosure.

FIG. 9 is a simplified top view of a semiconductor package in accordance with some alternative embodiments of the disclosure. The semiconductor package 600 illustrated in FIG. 9 is similar to the semiconductor package 400 illustrated in FIG. 7, hence the same reference numerals are used to refer to the same or liked parts, and its detailed description will be omitted herein. The difference between the semiconductor package 600 in FIG. 9 and the semiconductor package 400 in FIG. 7 lies in that the side surface CS of the chamfered corner CC in the semiconductor package 600 has a concavely-curved profile, while the side surface CS of the chamfered corner CC in the semiconductor package 400 has a convexly-curved profile.

In the semiconductor package 300 illustrated in FIG. 6, the exterior angle between the side surface CS1 or CS2 of the chamfered corner CC and the side surface connected with the said chamfered corner CC is greater than 0 degree and less than about 90 degree. However, the disclosure is not limited thereto. In some alternative embodiments, the exterior angle between the side surface CS1 or CS2 of the chamfered corner CC and the side surface connected with the said chamfered corner CC may be 90 degree. Hereinafter, other embodiments will be described with reference to FIG. 10 and FIG. 11.

Figure 10:
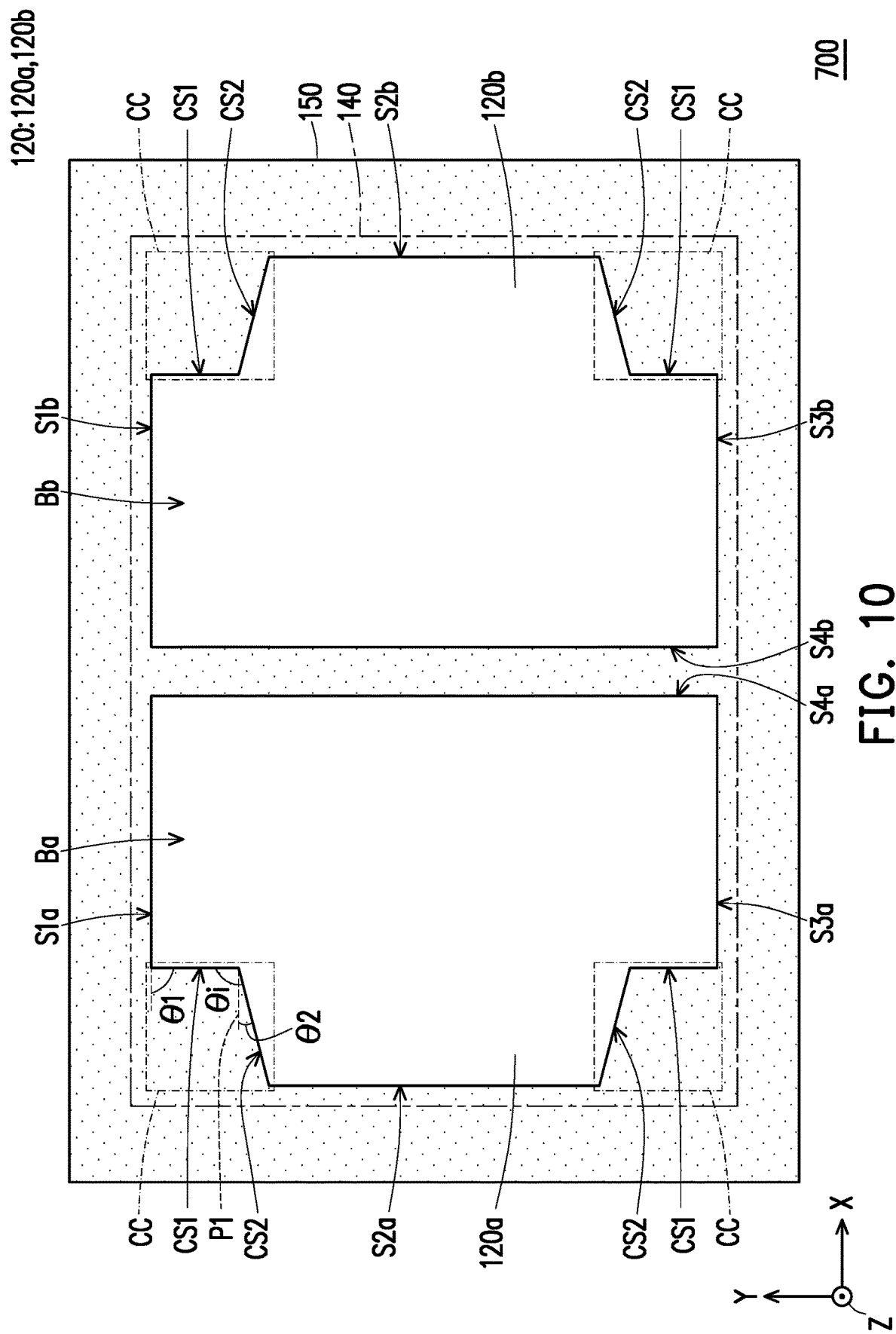
FIG. 10 is a simplified top view of a semiconductor package in accordance with some alternative embodiments of the disclosure.

FIG. 10 is a simplified top view of a semiconductor package in accordance with some alternative embodiments of the disclosure. The semiconductor package 700 illustrated in FIG. 10 is similar to the semiconductor package 300 illustrated in FIG. 6, hence the same reference numerals are used to refer to the same or liked parts, and its detailed description will be omitted herein. The differences between the semiconductor package 700 and the semiconductor package 300 will be described below.

Referring to FIG. 10, the exterior angle θ1 between the side surface CS1 and the side surface S1a is 90 degree, and the exterior angle θ2 between the side surface CS2 and the virtual plane P1 paralleled with the side surface S1a along the direction X is greater than 0 degree and less than about 45 degree. That is to say, in the embodiments of FIG. 10, the exterior angle θ1 is different from the exterior angle θ2, and the exterior angle θ1 is greater than the exterior angle θ2. With such configuration, the corners of the semiconductor dies 120 in the semiconductor package 700 are chamfered with concave edges. From another point of view, in some embodiments, the side surface CS1 and the side surface CS2 form an obtuse angle. As shown in FIG. 10, the included angle θi between the side surface CS1 and the side surface CS2 is an obtuse angle. In some embodiments, the included angle θi ranges from greater than 45° to less than 90°.

Figure 11:
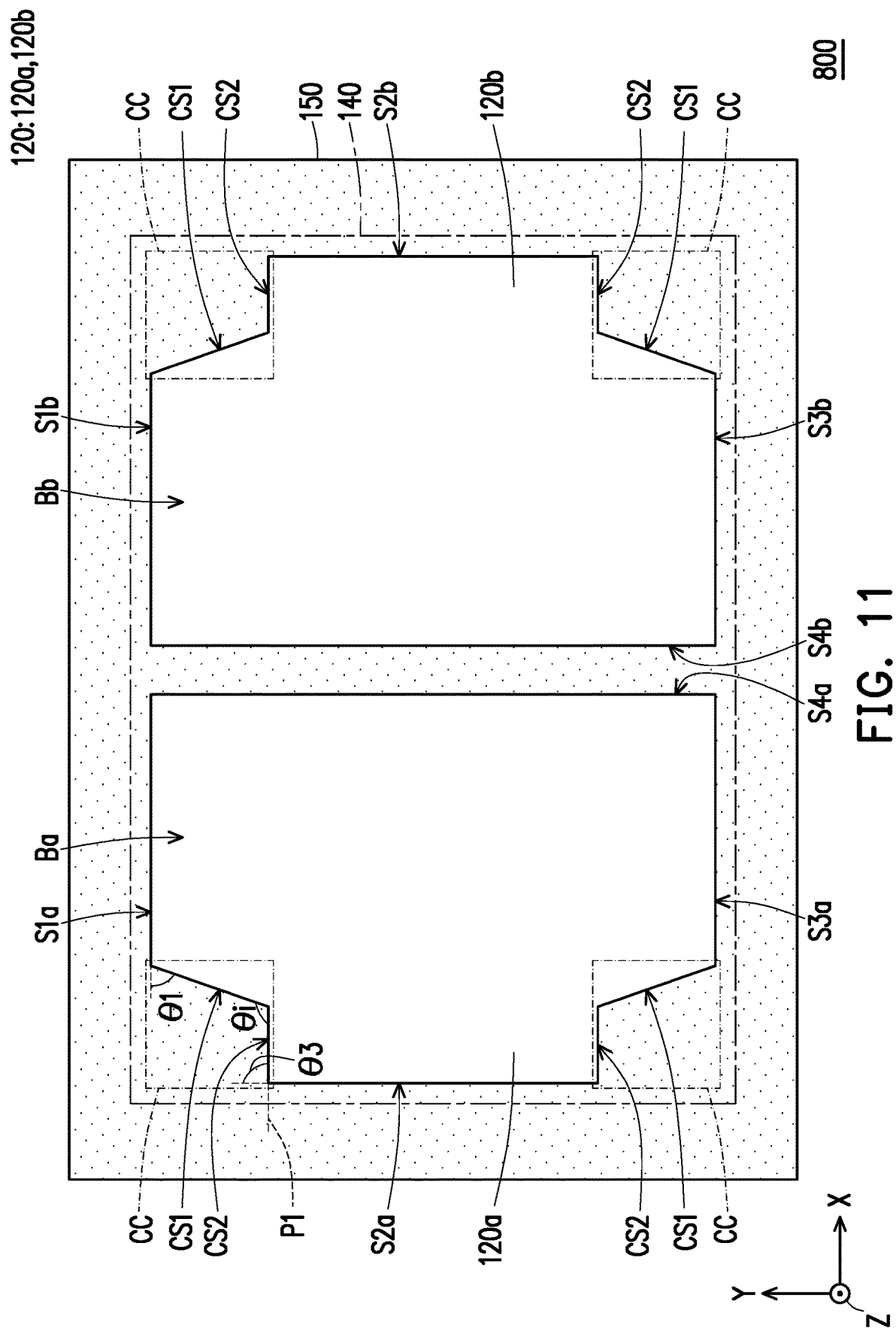
FIG. 11 is a simplified top view of a semiconductor package in accordance with some alternative embodiments of the disclosure.

FIG. 11 is a simplified top view of a semiconductor package in accordance with some alternative embodiments of the disclosure. The semiconductor package 800 illustrated in FIG. 11 is similar to the semiconductor package 300 illustrated in FIG. 6, hence the same reference numerals are used to refer to the same or liked parts, and its detailed description will be omitted herein. The differences between the semiconductor package 800 and the semiconductor package 300 will be described below.

Referring to FIG. 11, the exterior angle θ1 between the side surface CS1 and the side surface S1a is greater than 45 degree and less than about 90 degree, while the exterior angle between the side surface CS2 and the virtual plane P1 paralleled with the side surface S1a along the direction X is 0 degree. That is to say, in the embodiments of FIG. 11, the exterior angle θ1 between the side surface CS1 and the side surface S1a is different from the exterior angle between the side surface CS2 and the virtual plane P1 paralleled with the side surface S1a, and the exterior angle θ1 between the side surface CS1 and the side surface S1a is greater than the exterior angle between the side surface CS2 and the virtual plane P1 paralleled with the side surface S1a. With such configuration, the corners of the semiconductor dies 120 in the semiconductor package 800 are chamfered with concave edges. In other words, in the embodiments of FIG. 11, the side surface CS2 is paralleled with the side surface S1a, and the exterior angle θ3 between the side surface CS2 and the side surface S2a along the direction Y is 90 degree. From another point of view, in some embodiments, the side surface CS1 and the side surface CS2 form an obtuse angle. As shown in FIG. 11, the included angle θ1 between the side surface CS1 and the side surface CS2 is an obtuse angle. In some embodiments, the included angle θ1 ranges from greater than 45° to less than 90°.

In the semiconductor package 700 illustrated in FIG. 10 or the semiconductor package 800 illustrated in FIG. 11, one of the exterior angle between the side surface CS1 and the side surface S1a connected therewith and the exterior angle between the side surface CS2 and the side surface S2a connected therewith is 90 degree. However, the disclosure is not limited thereto. In some alternative embodiments, both of the exterior angle between the side surface CS1 and the side surface S1a connected therewith and the exterior angle between the side surface CS2 and the side surface S2a connected therewith are 90 degree. Hereinafter, other embodiments will be described with reference to FIG. 12 and FIG. 13.

Figure 12:
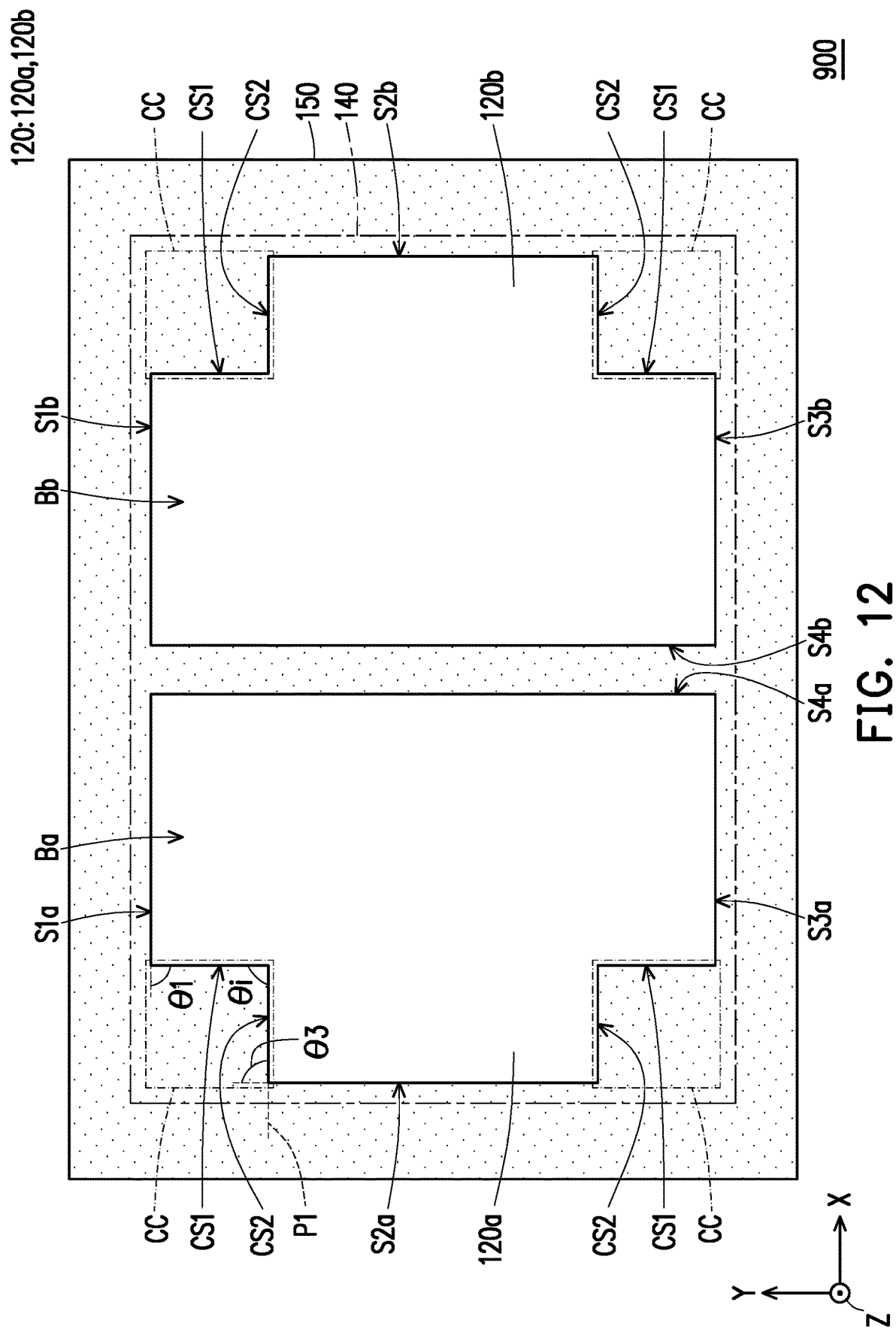
FIG. 12 is a simplified top view of a semiconductor package in accordance with some alternative embodiments of the disclosure.

FIG. 12 is a simplified top view of a semiconductor package in accordance with some alternative embodiments of the disclosure. The semiconductor package 900 illustrated in FIG. 12 is similar to the semiconductor package 800 illustrated in FIG. 11, hence the same reference numerals are used to refer to the same or liked parts, and its detailed description will be omitted herein. The differences between the semiconductor package 900 and the semiconductor package 800 will be described below.

Referring to FIG. 12, the exterior angle θ1 between the side surface CS1 and the side surface S1a is 90 degree, and the exterior angle θ3 between the side surface CS2 and the side surface S2a is 90 degree. That is to say, in the embodiments of FIG. 12, the side surface CS1 is perpendicular to the side surface CS2. With such configuration, the side surface CS1 and the side surface CS2 form a right angle. As shown in FIG. 12, the included angle θi between the side surface CS1 and the side surface CS2 is a right angle of 90 degree. From another point of view, as shown in FIG. 12, the exterior angle θ1 between the side surface CS1 and the side surface S1a is 90 degree, while the exterior angle between the side surface CS2 and the virtual plane P1 paralleled with the side surface S1a along the direction X is 0 degree. That is to say, in the embodiments of FIG. 12, the exterior angle θ1 between the side surface CS1 and the side surface S1a is different from the exterior angle between the side surface CS2 and the virtual plane P1 paralleled with the side surface S1a, and the exterior angle θ1 between the side surface CS1 and the side surface S1a is greater than the exterior angle between the side surface CS2 and the virtual plane P1 paralleled with the side surface S1a. With such configuration, the corners of the semiconductor dies 120 in the semiconductor package 900 are chamfered with concave edges.

Figure 13:
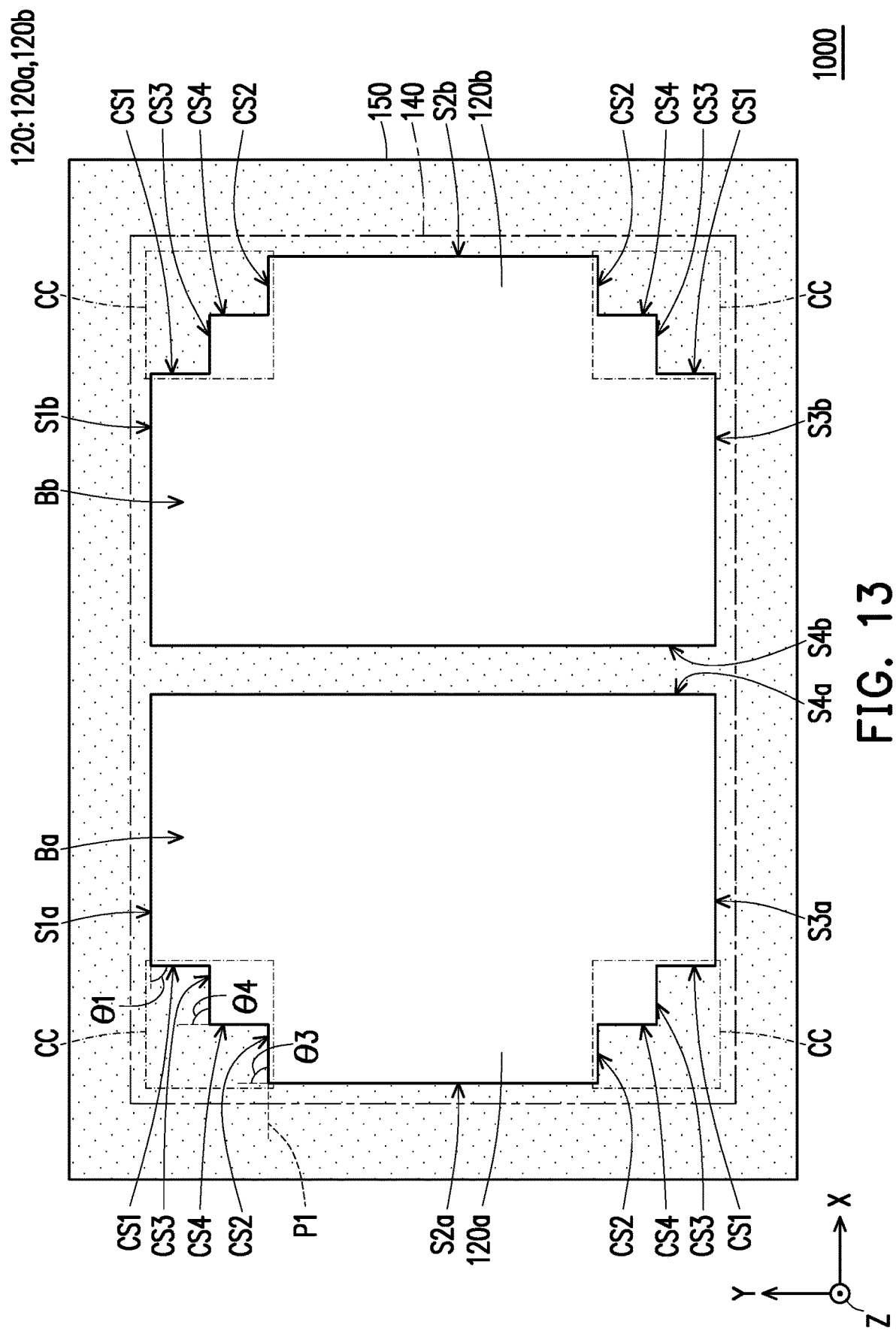
FIG. 13 is a simplified top view of a semiconductor package in accordance with some alternative embodiments of the disclosure.

FIG. 13 is a simplified top view of a semiconductor package in accordance with some alternative embodiments of the disclosure. The semiconductor package 1000 illustrated in FIG. 13 is similar to the semiconductor package 800 illustrated in FIG. 11, hence the same reference numerals are used to refer to the same or liked parts, and its detailed description will be omitted herein. The differences between the semiconductor package 1000 and the semiconductor package 800 will be described below.

Referring to FIG. 13, the exterior angle θ1 between the side surface CS1 and the side surface S1a is 90 degree, and the exterior angle θ3 between the side surface CS2 and the side surface S2a is 90 degree. That is to say, in the embodiments of FIG. 13, the side surface CS1 is perpendicular to the side surface CS2. From another point of view, as shown in FIG. 13, the exterior angle θ1 between the side surface CS1 and the side surface S1a is 90 degree, while the exterior angle between the side surface CS2 and the virtual plane P1 paralleled with the side surface S1a along the direction X is 0 degree. That is to say, in the embodiments of FIG. 13, the exterior angle θ1 between the side surface CS1 and the side surface S1a is different from the exterior angle between the side surface CS2 and the virtual plane P1 paralleled with the side surface S1a, and the exterior angle θ1 between the side surface CS1 and the side surface S1a is greater than the exterior angle between the side surface CS2 and the virtual plane P1 paralleled with the side surface S1a. With such configuration, the corners of the semiconductor dies 120 in the semiconductor package 1000 are chamfered with concave edges.

Continue referring to FIG. 13, in the semiconductor package 1000, each chamfered corner CC of the semiconductor dies 120 further includes a side surface CS3 and a side surface CS4, the side surface CS3 extends between the side surface CS1 and the side surface CS4, and the side surface CS4 extends between the side surface CS3 and the side surface CS2. That is to say, in the semiconductor package 1000, the chamfered corner CC of the semiconductor die 120 includes four side surfaces. In other words, in the semiconductor package 1000, the semiconductor die 120 includes twelve side surfaces. Further, as shown in FIG. 13, the exterior angle θ4 between the side surface CS3 and the side surface CS4 is 90 degree. That is to say, the side surface CS3 is paralleled with the side surface CS2, and the side surface CS4 is paralleled with the side surface CS1. However, the disclosure is not limited thereto. In some alternative embodiments, the exterior angle θ4 between the side surface CS3 and the side surface CS4 may be greater than 0 degree and less than about 90 degree.

As shown in FIG. 1 and FIG. 3, two semiconductor dies 120 are included in the semiconductor package 100. However, the disclosure is not limited thereto. In some alternative embodiments, more than two semiconductor dies may be included in the semiconductor package. Also, as shown in FIG. 1 and FIG. 3, each semiconductor die 120 included in the semiconductor package 100 includes two chamfered corners CC. However, the disclosure is not limited thereto. In some alternative embodiments, the semiconductor die included in the semiconductor package may include one chamfered corner CC or may not include chamfered corner CC. Hereinafter, other embodiments will be described with reference to FIG. 14 and FIG. 15.

Figure 14:
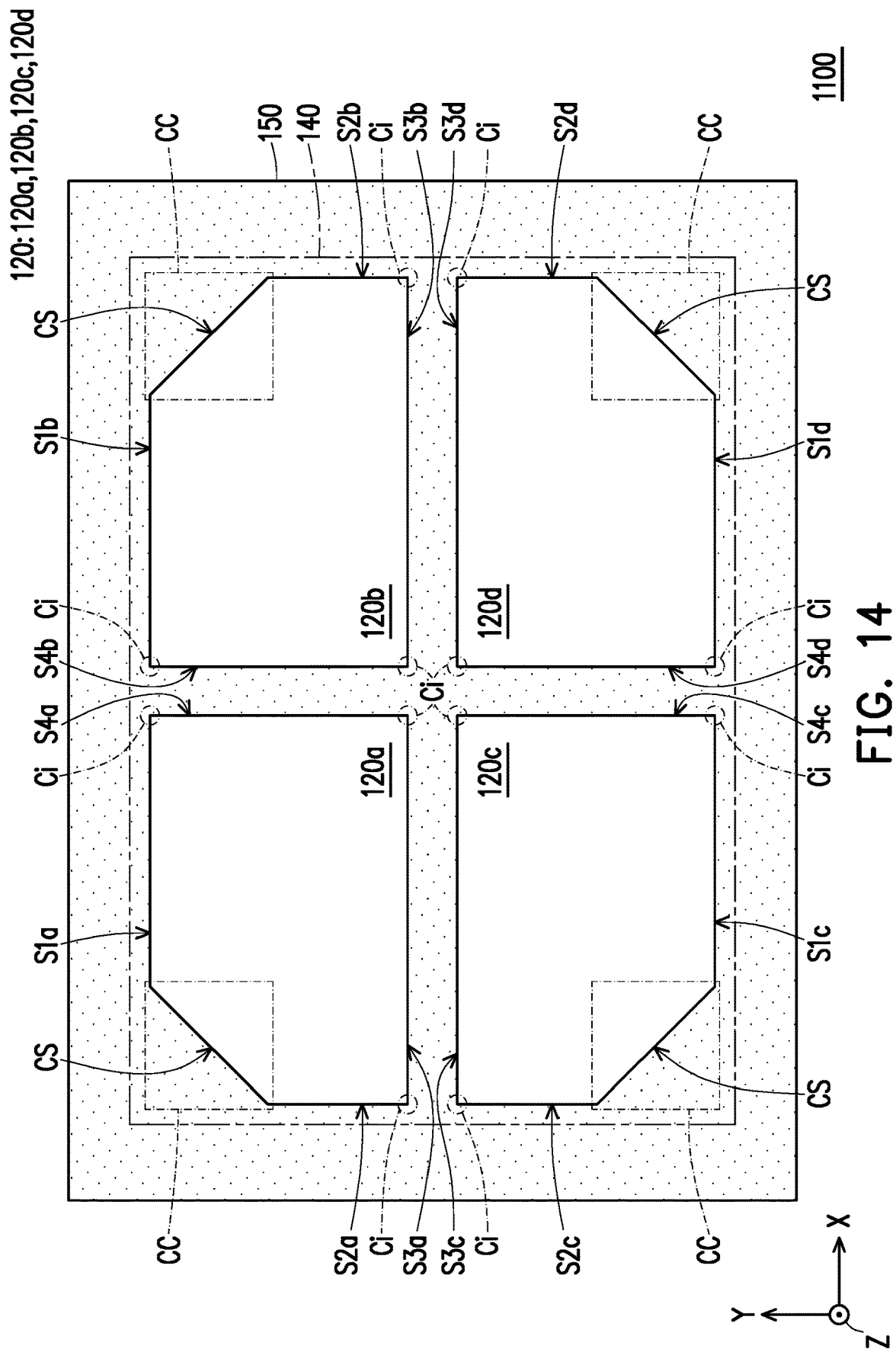
FIG. 14 is a simplified top view of a semiconductor package in accordance with some alternative embodiments of the disclosure.

FIG. 14 is a simplified top view of a semiconductor package in accordance with some alternative embodiments of the disclosure. The semiconductor package 1100 illustrated in FIG. 14 is similar to the semiconductor package 100 illustrated in FIG. 3, hence the same reference numerals are used to refer to the same or liked parts, and its detailed description will be omitted herein. The differences between the semiconductor package 1100 and the semiconductor package 100 will be described below.

Referring to FIG. 14, a semiconductor die 120a, a semiconductor die 120b, a semiconductor die 120c and a semiconductor die 120d are included in the semiconductor package 1100. It is noted that when it is not necessary to differentiate between the semiconductor dies 120a-120d, the semiconductor dies 120a-120d may be collectively referred to as semiconductor dies 120.

As shown in FIG. 14, in the semiconductor package 1100, four semiconductor dies 120a-120d are disposed in an array of two rows by two columns. In detail, as shown in FIG. 14, the semiconductor die 120a faces the semiconductor die 120b in the same row along the direction X and the semiconductor die 120c in the same column along the direction Y; the semiconductor die 120b faces the semiconductor die 120a in the same row along the direction X and the semiconductor die 120d in the same column along the direction Y; the semiconductor die 120c faces the semiconductor die 120d in the same row along the direction X and the semiconductor die 120a in the same column along the direction Y; and the semiconductor die 120d faces the semiconductor die 120c in the same row along the direction X and the semiconductor die 120b in the same column along the direction Y. As such, in the semiconductor package 1100, the side surfaces S1a-S2a of the semiconductor die 120a, the side surfaces S1b-S2b of the semiconductor die 120b, the side surfaces S1c-S2c of the semiconductor die 120c, and the side surfaces S1d-S2d of the semiconductor die 120d may be referred to as outer side surfaces; and the side surfaces S3a-S4a of the semiconductor die 120a, the side surfaces S3b-S4b of the semiconductor die 120b, the side surfaces S2c-S4c of the semiconductor die 120c, and the side surfaces S3d-S4d of the semiconductor die 120d may be referred to as inner side surfaces. That is to say, in the semiconductor package 1100, each semiconductor die 120 includes two outer side surfaces and two inner side surfaces. With such configuration, in the semiconductor package 1100, each of the semiconductor dies 120 may include one chamfered corner CC and three corners C. In detail, taking the semiconductor die 120a as an example, the chamfered corner CC is connected with the outer side surface S1a and the outer side surface S2a, and three corners C respectively are formed by the outer side surface S1a and the inner side surface S4a, by the inner side surface S4a and the inner side surface S3a, and by the inner side surface S3a and the outer side surface S2a. Further, as shown in FIG. 14, the chamfered corner CC of one of the semiconductor dies 120 does not face toward the others of the semiconductor dies 120, while each corner Ci of one of the semiconductor dies 120 faces toward the corresponding corner Ci of the others of the semiconductor dies 120.

Figure 15:
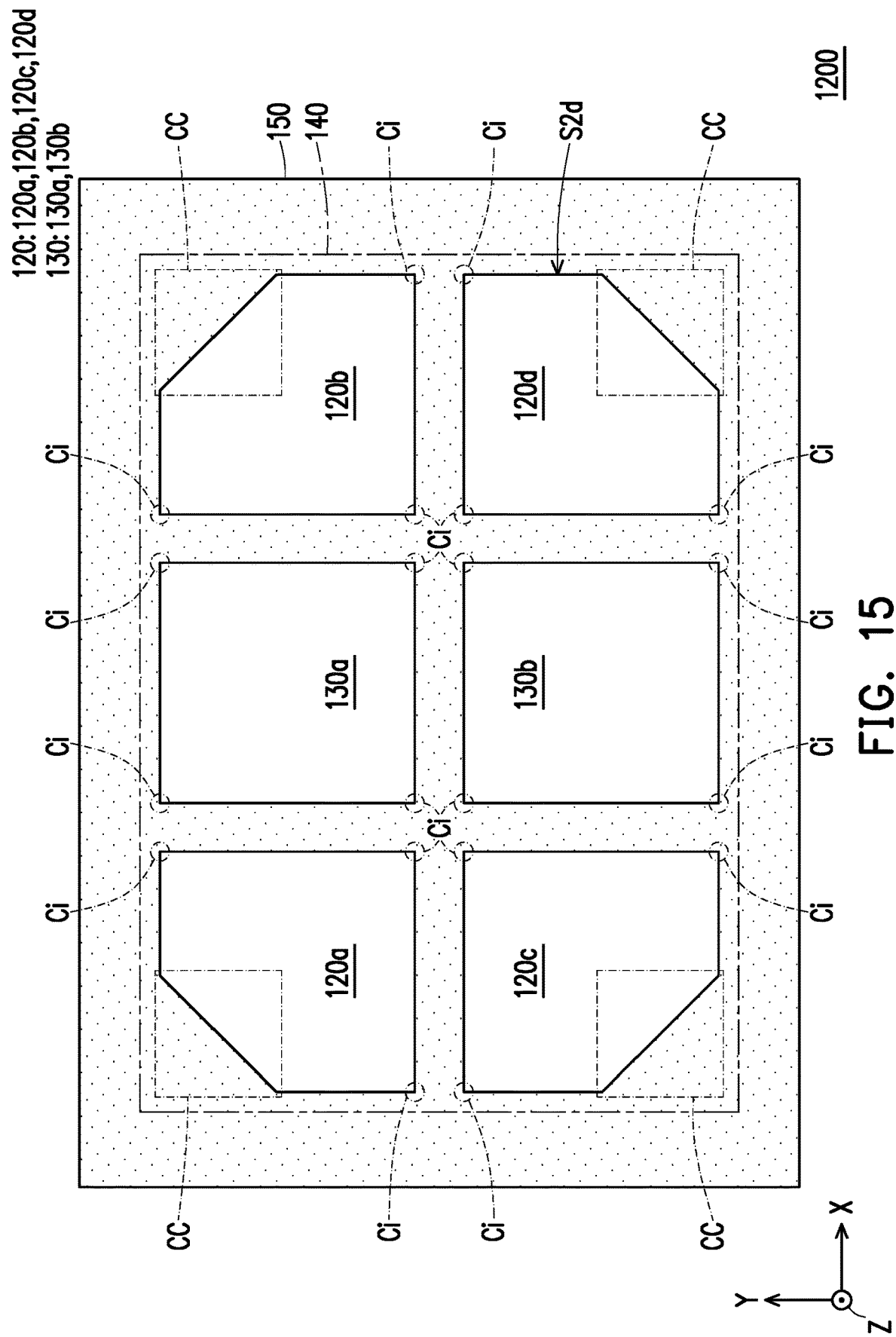
FIG. 15 is a simplified top view of a semiconductor package in accordance with some alternative embodiments of the disclosure.

FIG. 15 is a simplified top view of a semiconductor package in accordance with some alternative embodiments of the disclosure. The semiconductor package 1200 illustrated in FIG. 15 is similar to the semiconductor package 1100 illustrated in FIG. 14, hence the same reference numerals are used to refer to the same or liked parts, and its detailed description will be omitted herein. The differences between the semiconductor package 1200 and the semiconductor package 1100 will be described below.

Referring to FIG. 15, a semiconductor die 130a and a semiconductor die 130b are further included in the semiconductor package 1200. It is noted that when it is not necessary to differentiate between the semiconductor dies 130a-130a, the semiconductor dies 130a-130a may be collectively referred to as semiconductor dies 130.

As shown in FIG. 15, in the semiconductor package 1200, six semiconductor dies 120a-120d and 130a-130b are disposed in an array of two rows by three columns. In detail, as shown in FIG. 15, the semiconductor die 120a faces the semiconductor die 130a in the same row along the direction X and the semiconductor die 120c in the same column along the direction Y; the semiconductor die 120b faces the semiconductor die 130a in the same row along the direction X and the semiconductor die 120d in the same column along the direction Y; the semiconductor die 120c faces the semiconductor die 130b in the same row along the direction X and the semiconductor die 120a in the same column along the direction Y; the semiconductor die 120*d* faces the semiconductor die 130*b* in the same row along the direction X and the semiconductor die 120*b* in the same column along the direction Y; and the semiconductor die 130*a* faces the semiconductor die 130*b* in the same column along the direction Y. As such, in the semiconductor package 1200, the semiconductor dies 120*a*, 120*b*, 120*c* and 120*d* may be referred to as outer semiconductor dies, as each one has two adjacent side surfaces which do not face another semiconductor die of the array (e.g., the side surfaces S1*a* and S1*b* of the semiconductor dies 120*a* shown in FIG. 14); while the semiconductor dies 130*a* and 130*b* may be referred to as inner semiconductor dies, as each one has only one side surface which does not face another semiconductor die of the array. As shown in FIG. 15, each outer semiconductor die 120*a*, 120*b*, 120*c*, 120*d* has one chamfered corner CC, while each inner semiconductor dies 130 is provided with four corners C and without any chamfered corner.

In each of the semiconductor packages 100-1200, the chamfered corners CC have the same configuration. However, the disclosure is not limited thereto. In some alternative embodiments, the chamfered corners included in the semiconductor package may have different configurations. For example, referring to FIG. 16, in the semiconductor package 1300, the configuration of the chamfered corner CC connected with the side surface S1*a* and the side surface S2*a*, the configuration of the chamfered corner CC connected with the side surface S2*a* and the side surface S3*a*, the configuration of the chamfered corner CC connected with the side surface S1*b* and the side surface S2*b*, and the configuration of the chamfered corner CC connected with the side surface S2*b* and the side surface S3*b* are different from each other.

In the semiconductor die 120 illustrated in FIG. 1 and FIG. 3, the side surface CS of the chamfered corner CC is in direct contact with the back surface and the front surface. However, the disclosure is not limited thereto. In some alternative embodiments, the side surface CS of the chamfered corner CC is in direct contact with the back surface without in contact with the front surface. Hereinafter, other embodiments will be described with reference to FIG. 17 and FIG. 18.

Figure 17:
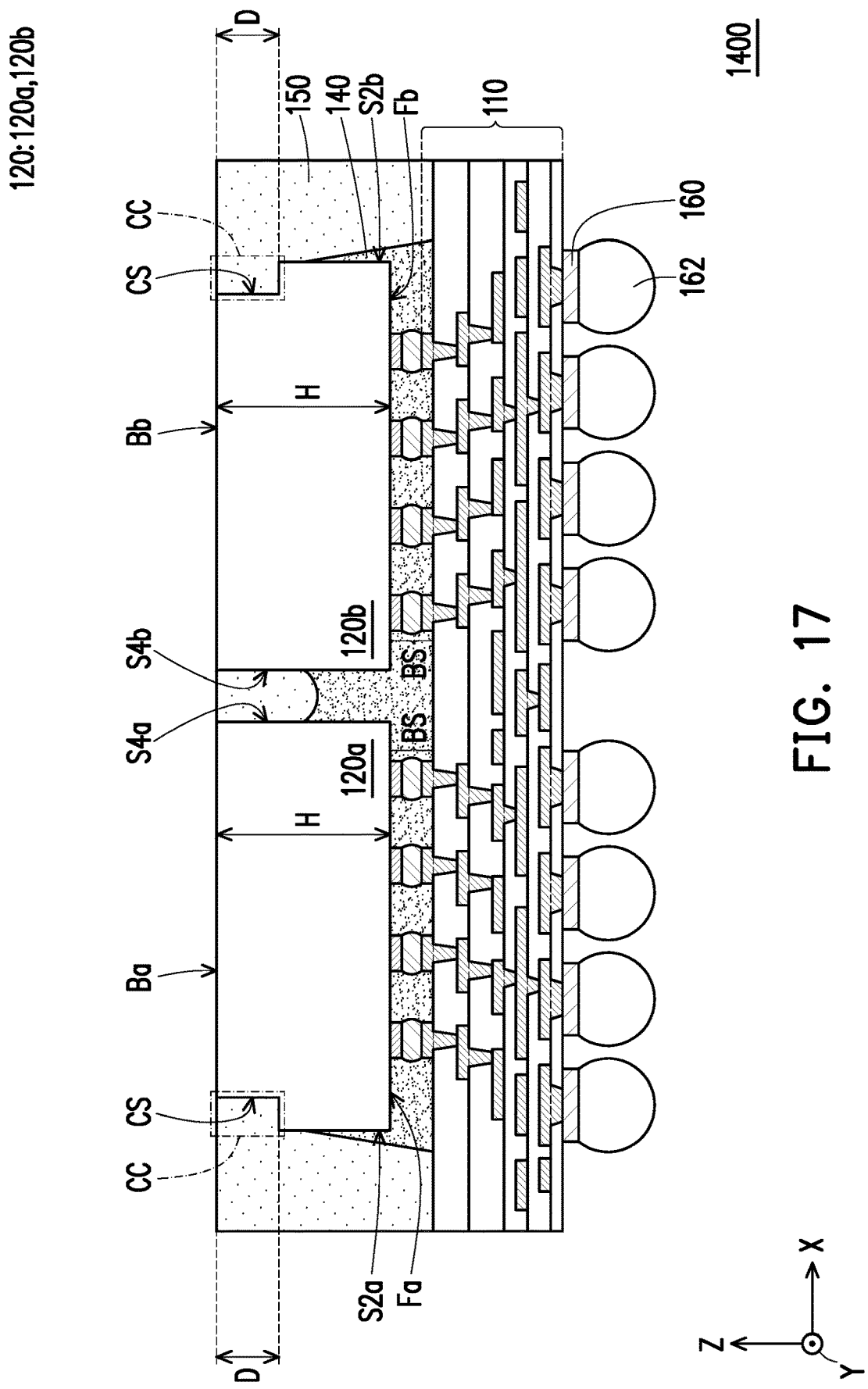
FIG. 17 is a schematic cross-sectional view of a semiconductor package in accordance with some alternative embodiments of the disclosure.
Figure 18:
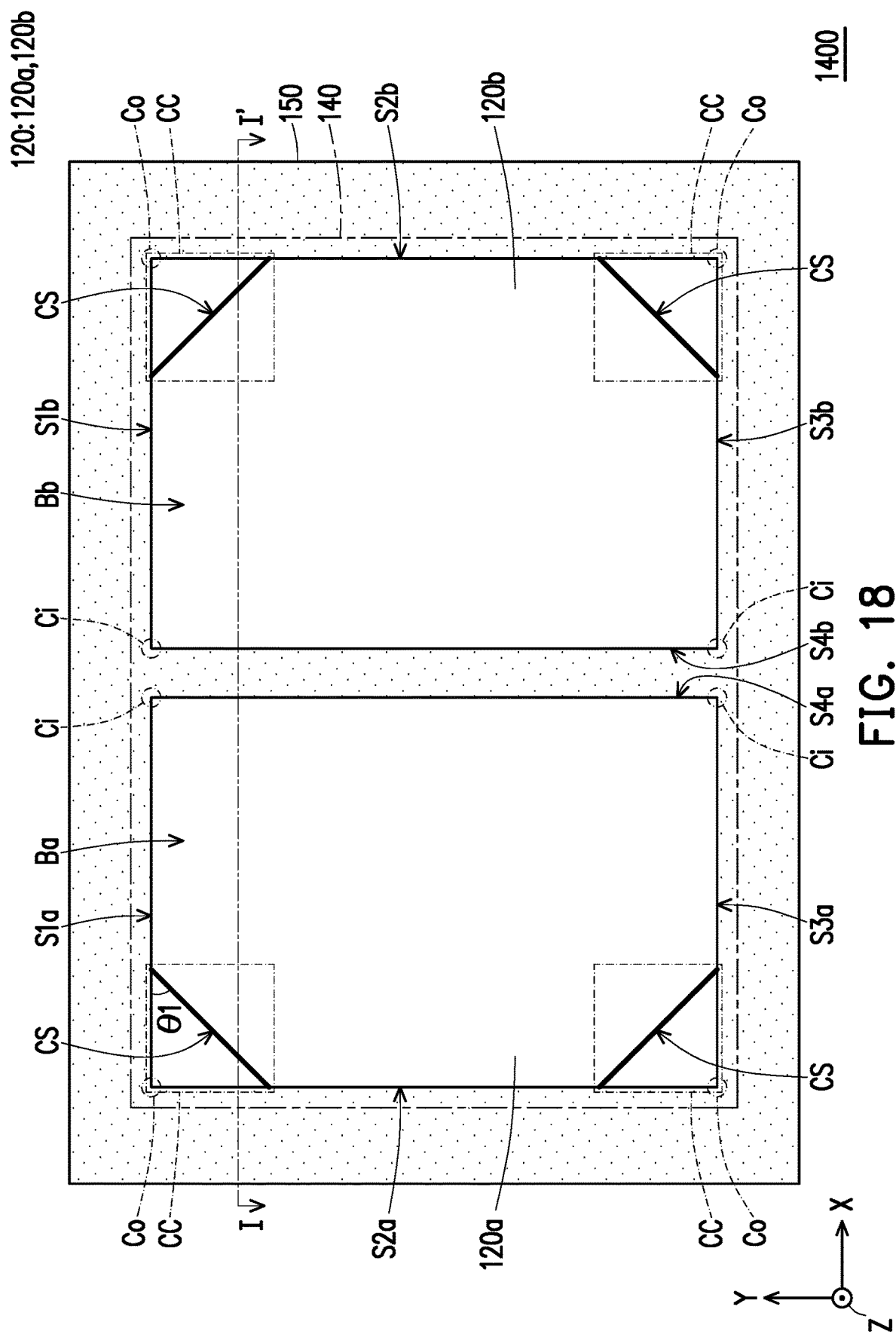
FIG. 18 is a simplified top view of a semiconductor package in accordance with some alternative embodiments of the disclosure.

FIG. 17 is a schematic cross-sectional view of a semiconductor package in accordance with some alternative embodiments of the disclosure. FIG. 18 is a simplified top view of a semiconductor package in accordance with some alternative embodiments of the disclosure. Specifically, FIG. 17 is a cross-sectional view taken along the line I-I' of FIG. 18. For simplicity and clarity of illustration, some elements are omitted in the simplified top view of FIG. 18, and these elements might not be locates in the same plane. The semiconductor package 1400 illustrated in FIG. 17 and FIG. 18 is similar to the semiconductor package 100 illustrated in FIG. 1 and FIG. 3, hence the same reference numerals are used to refer to the same or liked parts, and its detailed description will be omitted herein. The differences between the semiconductor package 1400 and the semiconductor package 100 will be described below.

Referring to FIG. 17 and FIG. 18, in the semiconductor die 120*a*, the side surface CS connects the back surface Ba at its illustrated top edge without connecting the front surface Fa at its illustrated bottom edge; and in the semiconductor die 120*b*, the side surface CS connects the back surface Bb at its illustrated top edge without connecting the front surface Fb at its illustrated bottom edge. That is to say, in the semiconductor package 1400, the chamfered corner CC is in direct contact with the back surface (e.g., the back surface Ba or the back surface Bb) without in contact with the front surface (e.g., the front surface Fa or the front surface Fb). In some embodiments, in the semiconductor package 1400, the depth D of the chamfered corner CC along the direction Z is greater than or equal to about 5 micrometers and less than the height H of the semiconductor die 120 along the direction Z. From another point of view, as shown in FIG. 18, the outer corner Co formed by two outer side surfaces (e.g., the side surface S1*a* and the side surface S2*a*, the side surface S2*a* and the side surface S3*a*, the side surface S1*b* and the side surface S2*b*, or the side surface S2*b* and the side surface S3*b*) remains in the semiconductor die 120. That is to say, in the semiconductor package 1400, the outer corner Co formed by two outer side surfaces of the semiconductor die 120 is partially chamfered. In other words, in the semiconductor package 1400, the chamfered corner CC is formed by partially removing the outer corner Co.

Further, as shown in FIG. 17 and FIG. 18, in the semiconductor package 1400, the chamfered corner CC is fully encapsulated by the encapsulant 150 without in contact with the underfill layer 140. However, the disclosure is not limited thereto. In some alternative embodiments, in the semiconductor package 1400, a portion of the side surface CS of the chamfered corner CC is in direct contact with the underfill layer 140, while another portion of the side surface CS of the chamfered corner CC is in direct contact with the encapsulant 150.

In some embodiments, the semiconductor die 120 of the semiconductor package 1400 is chamfered by a laser cutting process. In some alternative embodiments, the semiconductor die 120 of the semiconductor package 1400 is chamfered by a blade cutting process, which is described in details below with reference to FIG. 19A to FIG. 19D. FIG. 19A to FIG. 19D are simplified top views illustrating a manufacturing process of a semiconductor die in accordance with some embodiments of the disclosure. For simplicity and clarity of illustration, some elements are omitted in the simplified top views of FIG. 19A to FIG. 19D, and these elements might not be locates in the same plane.

Figure 19B:
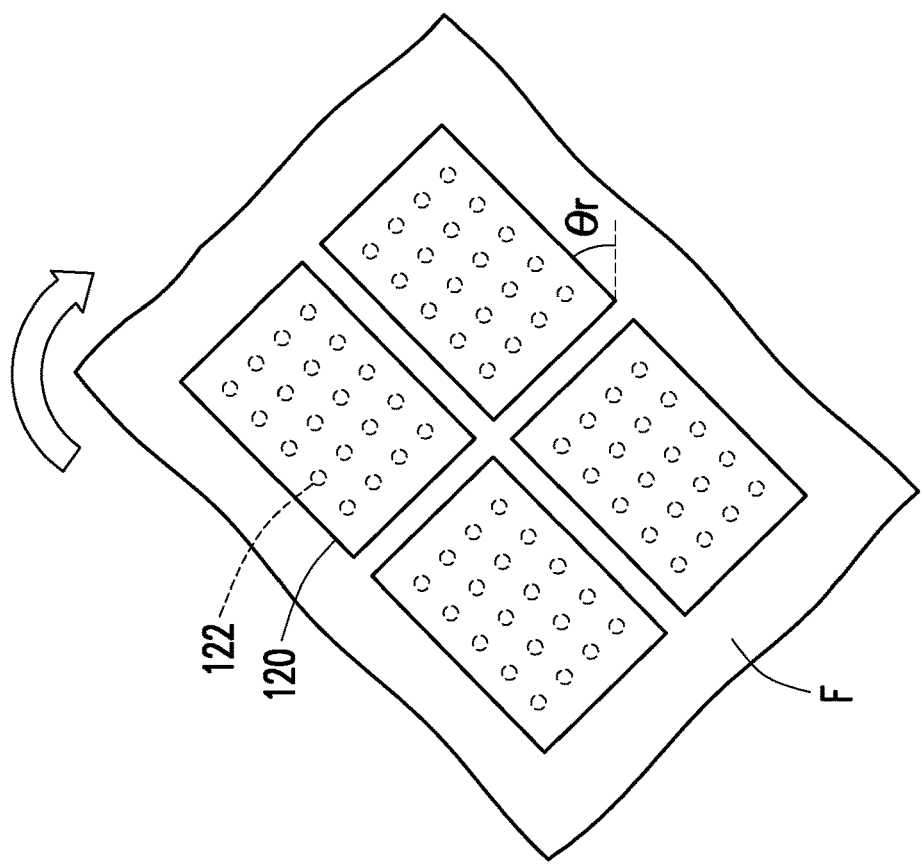
FIG. 19A to FIG. 19D are simplified top views illustrating a manufacturing process of a semiconductor die in accordance with some embodiments of the disclosure.
Figure 19A:
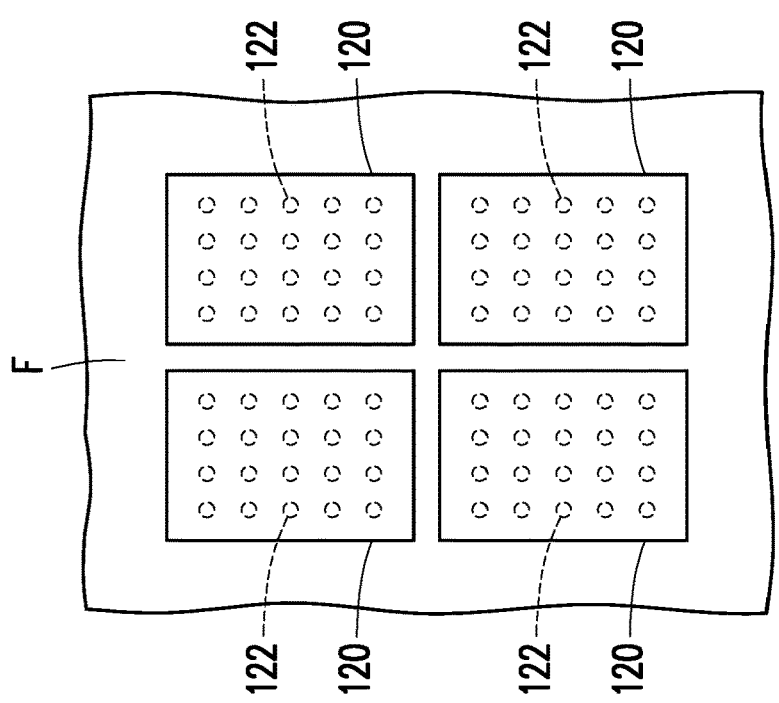

Referring to FIG. 19A, the singulated semiconductor dies 120 are turned upside down and placed on a tape frame F for further processing. In some embodiments, the connector structures 122 (shown as the dotted lines) of the semiconductor dies 120 are attached to the tape frame F. It is noted that although four semiconductor dies 120 are shown for simplicity in FIG. 19A, the disclosure is not limited by the embodiments or figures shown herein, and those skilled in the art can understand that more than four semiconductor dies 120 arranged in an array may be provided on the tape frame F. As shown in FIG. 19A, although twelve connector structures 122 are presented for illustrative purposes, those skilled in the art can understand that the number of the connector structures 122 may be more than or less than what is depicted in FIG. 19A, and may be designated based on demand and/or design layout.

Referring to FIG. 19B, the semiconductor dies 120 placed on the tape frame F are rotated an angle θr. In some embodiments, the angle θr is greater than 0 degree and less than about 90 degree. In some embodiments, as shown in FIG. 19B, the semiconductor dies 120 are rotated in the clockwise direction. However, the disclosure is not limited thereto. In some alternative embodiments, the semiconductor dies 120 are rotated in the counter clockwise direction. In some embodiments, the rotation process of the semiconductor dies 120 is performed by a rotation mechanism for rotating the tape frame F.

Figure 19D:
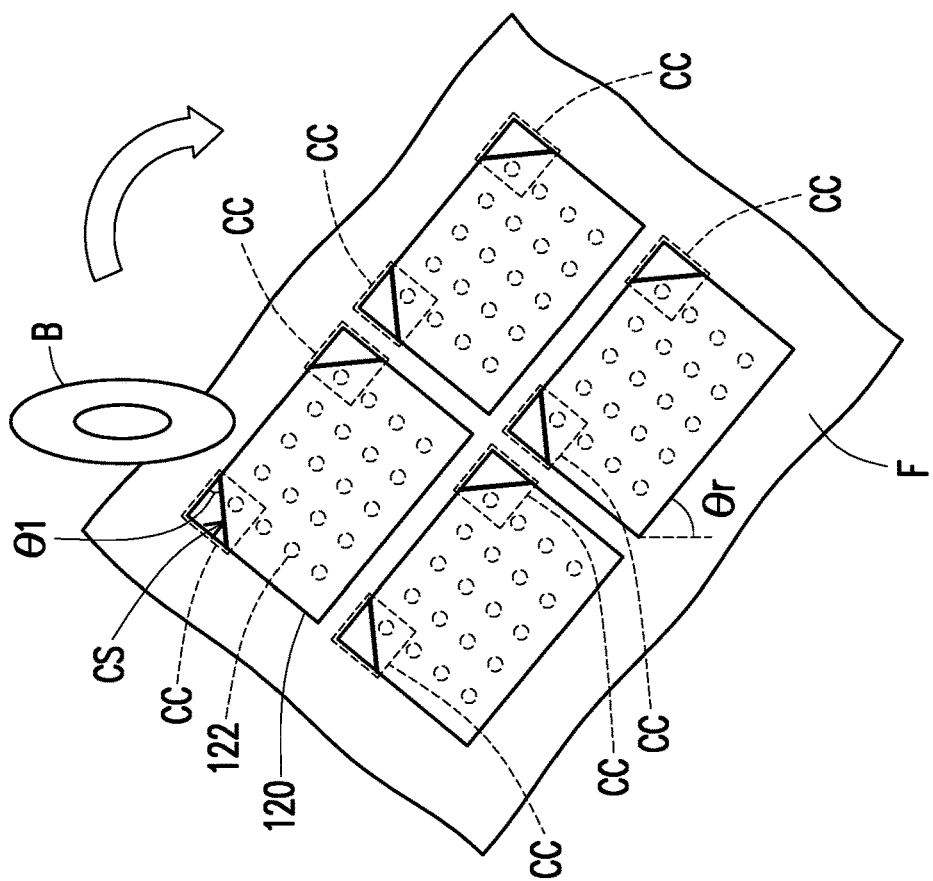
Figure 19C:
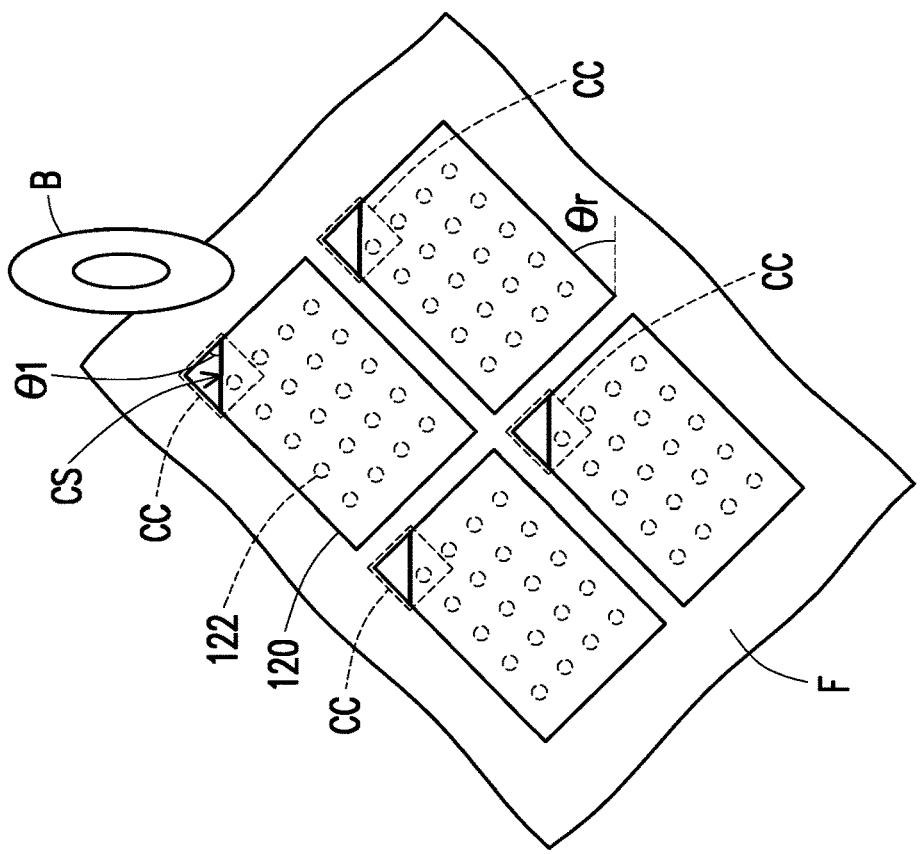

Referring to FIG. 19C, after the semiconductor dies 120 are rotated, the semiconductor dies 120 are chamfered with a blade B to render the chamfered corners CC. In this stage, the exterior angle θ1 between the side surface CS and the side surface connected with the side surface CS (e.g., the side surface S1a as shown in FIG. 18) is substantially equal to the angle θr.

Referring to FIG. 19D, the semiconductor dies 120 further are rotated 90 degree in the clockwise direction, and then the semiconductor dies 120 are chamfered with the blade B to render each semiconductor die 120 with two chamfered corners CC. In this stage, the exterior angle θ1 between the side surface CS and the side surface connected with the side surface CS (e.g., the side surface S3a as shown in FIG. 18) is substantially equal to the angle θr.

Figure 20:
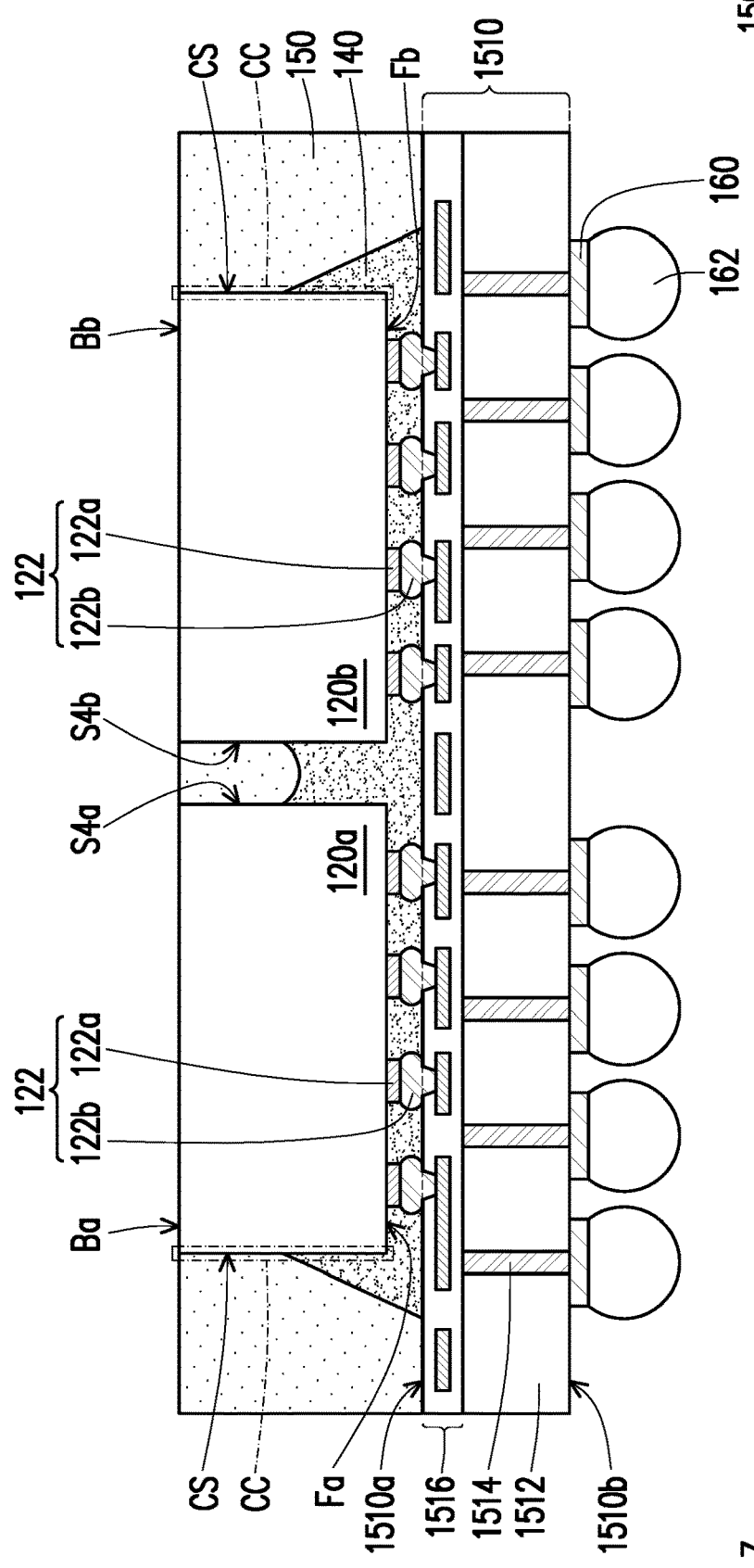
FIG. 20 is a schematic cross-sectional view of a semiconductor package in accordance with some alternative embodiments of the disclosure.

FIG. 20 is a schematic cross-sectional view of a semiconductor package in accordance with some alternative embodiments of the disclosure. The semiconductor package 1500 illustrated in FIG. 20 is similar to the semiconductor package 100 illustrated in FIG. 1, hence the same reference numerals are used to refer to the same or liked parts, and its detailed description will be omitted herein. The difference between the semiconductor package 1500 in FIG. 20 and the semiconductor package 100 in FIG. 1 lies in that, the interposer 110 of the semiconductor package 100 is an organic interposer, while the interposer 1510 of the semiconductor package 1500 is a silicon interposer. The silicon interposer is beneficial to integrate one or more passive devices (e.g., capacitors) into the package structure. In some embodiments, the one or more passive devices are embedded and buried in the silicon interposer upon the design requirements.

In some embodiments, the interposer 1510 includes a substrate 1512, through substrate vias 1514 and a conductive structure 1516. The substrate 1512 may include elementary semiconductor such as silicon. The substrate 1512 may be doped as needed. The through substrate vias 1514 (also called "through silicon vias" in some examples) extend from a side (e.g., front side) of the substrate 1512 toward another side (e.g., back side) of the substrate 1512.

In some embodiments, the conductive structure 1516 is optionally disposed over the substrate 1512. In some embodiments, the conductive structure 1516 includes dielectric layers and conductive features embedded in the dielectric layers. The conductive features include metal lines, metal vias, metal pads and/or metal connectors. In some embodiments, the material of each conductive feature includes Cu, Al, Ti, Ta, W, Ru, Co, Ni, the like, or a combination thereof. In some embodiments, a seed layer and/or a barrier layer may be disposed between each conductive feature and the adjacent dielectric layer. The seed layer may include Ti/Cu. The barrier layer may include Ta, TaN, Ti, TiN, CoW or a combination thereof. In some embodiments, the material of each dielectric layer includes silicon oxide, silicon nitride, silicon oxynitirde, SiOC, the like, or a combination thereof. An etching stop layer may be interposed between two adjacent dielectric layers. The dielectric layers of the first conductive structure 1516 may be replaced by polymer layers or insulating layers as needed. In some embodiments, each polymer layer includes a photosensitive material such as PBO, polyimide (PI), BCB, the like, or a combination thereof.

In some embodiments, the interposer 1510 is an active interposer that contains at least one functional device or integrated circuit device included in the conductive structure 1516. Such active interposer is referred to as a "device-containing silicon interposer" in some examples. In some embodiments, the functional device includes an active device, a passive device, or a combination thereof. The functional device includes, for example but not limited to, transistors, capacitors, resistors, diodes, photodiodes, fuse devices and/or other similar components. In other embodiments, the interposer 1510 is a passive interposer, which is used to convey a lack of a functional device or integrated circuit device. Such passive interposer is referred to as a "device-free silicon interposer" in some examples.

In some embodiments, as shown in FIG. 20, the connector structures 122 of the semiconductor die 120 are bonded to the exposed conductive features of the conductive structure 1516 at the surface 1510a (i.e., the illustrated top surface) of the interposer 1510 to render electrical connection between the semiconductor die 120 and the interposer 1510. In some embodiments, as shown in FIG. 20, the UBM patterns 160 and the conductive terminals 162 are arranged on the surface 1510b (i.e., the illustrated bottom surface) of the interposer 1510 opposite to the surface 1510a. Further, in some embodiments, as shown in FIG. 20, the UBM patterns 160 and the conductive terminals 162 are electrically connected with the exposed through substrate vias 1514 at the surface 1510b.

Figure 21:
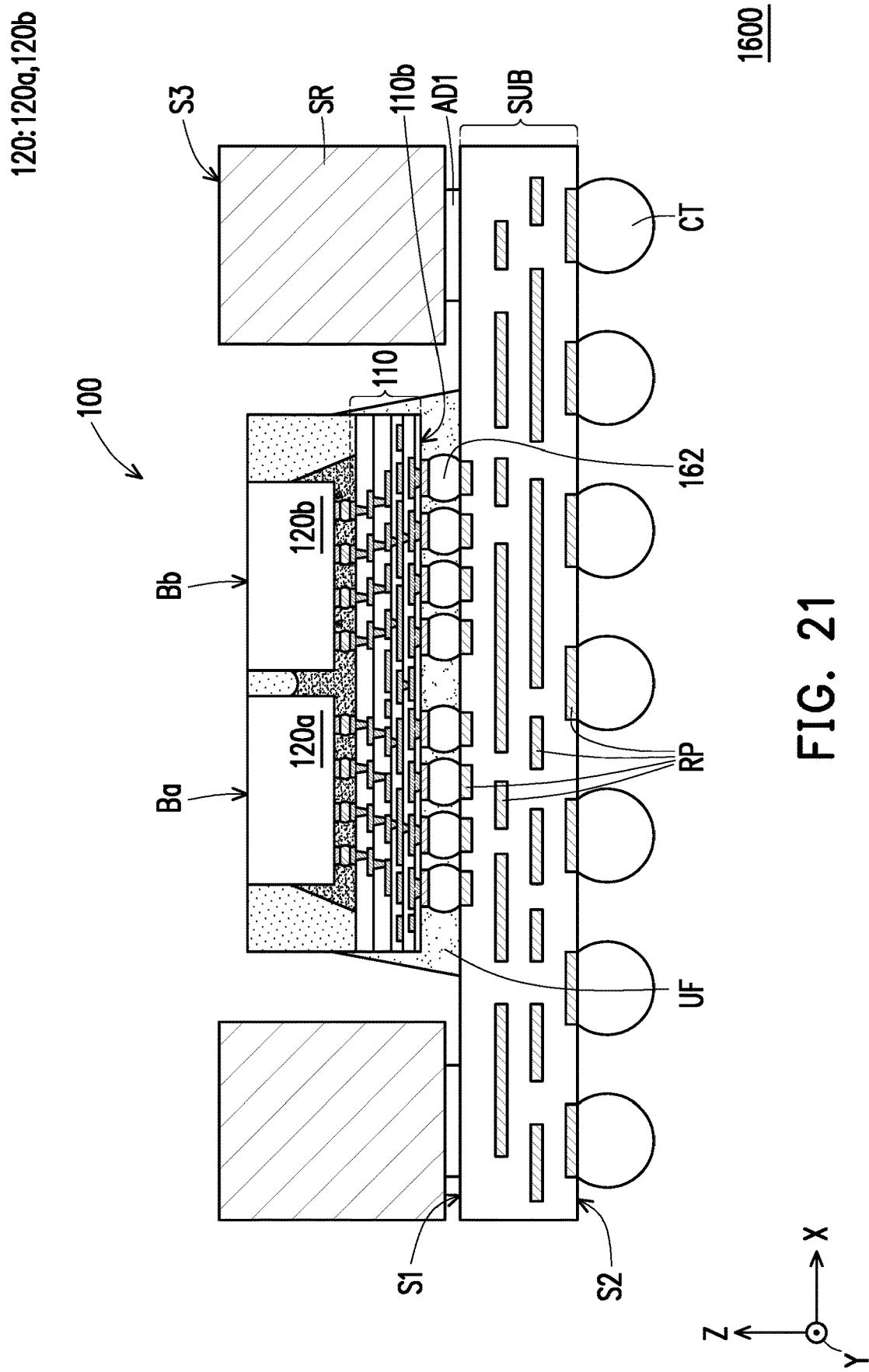
FIG. 21 is a schematic cross-sectional view of a semiconductor package in accordance with some alternative embodiments of the disclosure.

FIG. 21 is a schematic cross-sectional view of a semiconductor package in accordance with some alternative embodiments of the disclosure. In detail, FIG. 20 shows an application of the semiconductor package 100 described in conjunction with FIG. 1 to FIG. 4E in accordance with some embodiments. Referring to FIG. 20, a semiconductor package 1600 includes the semiconductor package 100, a package substrate SUB, an underfill layer UF, a plurality of conductive terminals CT, a stiffener ring SR and an adhesive layer AD1.

As shown in FIG. 21, the semiconductor package 100 is mounted to the package substrate SUB. In some embodiments, the package substrate SUB is a printed circuit board (PCB) or the like. In some embodiments, the package substrate SUB is referred to as a circuit substrate. In some embodiments, the package substrate SUB includes a plurality of routing patterns RP embedded therein. In some embodiments, the routing patterns RP are interconnected with one another. That is, the routing patterns RP are electrically connected to one another. As illustrated in FIG. 20, the package substrate SUB has a surface S1 (i.e., the illustrated top surface) and a surface S2 (i.e., the illustrated bottom surface) opposite to the surface S1. In some embodiments, some of the routing patterns RP are exposed at the surface S1 and some of the routing patterns RP are exposed at the surface S2. Further, as shown in FIG. 20, the semiconductor package 100 is bonded to the package substrate SUB through the conductive terminals 162. For example, the conductive terminals 162 of the semiconductor package 100 are in physical contact with the routing patterns RP exposed at the surface S1 of the package substrate SUB to render electrical connection between the semiconductor package 100 and the package substrate SUB. In some embodiments, after the conductive terminals 162 are attached to the routing patterns RP of the package substrate SUB, a reflow process may be performed to reshape the conductive terminals 162. In some embodiments, the semiconductor package 100 is attached to the package substrate SUB through flip-chip bonding. In other words, the semiconductor package 100 is placed such that the second surface 110b of the interposer 110 faces toward the package substrate SUB. It should be noted that although FIG. 20 illustrated that only the semiconductor package 100 is attached to the package substrate SUB, the disclosure is not limited thereto. In some alternative embodiments, other components may also be attached to the package substrate SUB.

In some embodiments, the underfill layer UF is disposed between the semiconductor package 100 and the package substrate SUB. For example, the underfill layer UF wraps around or encapsulates the conductive terminals 162 of the semiconductor package 100. Owing to the underfill layer UF, a bonding strength between the semiconductor package 100 and the package substrate SUB is enhanced, thereby improving the reliability of the semiconductor package 1600. In some embodiments, the underfill layer UF further covers portions of each sidewall of the semiconductor package 100. In some embodiments, the material of the underfill layer UF is similar to the material of the underfill layer 140 mentioned for the semiconductor package 100. Therefore, the detailed description of the underfill layer UF will be omitted herein.

In some embodiments, the conductive terminals CT are disposed on the surface S2 of the package substrate SUB. In some embodiments, the conductive terminals CT are solder balls, ball grid array (BGA) balls, or the like. In some embodiments, the conductive terminals CT are made of a conductive material with low resistivity, such as Sn, Pb, Ag, Cu, Ni, Bi, or an alloy thereof. In some embodiments, the conductive terminals CT are in physical contact with the routing patterns RP exposed at the surface S2 of the package substrate SUB.

In some embodiments, the stiffener ring SR is adhered on the package substrate SUB by the adhesive layer AD1. In some embodiments, the stiffener ring SR has a quadrangular ring-like shape in the plane views such as the top view or the bottom view, the disclosure is not limited thereto. In some alternative embodiments, the pattern of the stiffener ring SR may be designed based on the various design. Noted that the stiffener ring SR is attached on the package substrate SUB and surrounds the semiconductor package 100 to constrain the package substrate SUB in order to prevent its warpage or other movement relative to the semiconductor package 100, which may be caused by thermal cycling during package assembly, reliability testing, or field operation. The warpage and stress in the dies or package may lead to die performance degradation or package failure.

In some embodiments, the stiffener ring SR is formed of a rigid yet flexible material. In one exemplary embodiment, the stiffener ring SR is formed from a metal material with high thermal conductivity (k), such as steel, stainless steel, copper, aluminum, copper tungsten, the like, or combinations thereof. In another embodiment, the stiffener ring SR includes a ceramic material. In yet another embodiment, the stiffener ring SR includes a silicon containing material. In yet another embodiment, the stiffener ring SR includes a composite alloy. In yet another embodiment, the stiffener ring SR includes a plastic material. In the present embodiment, the material of the stiffener ring SR is typically selected to have a CTE the same as or sufficiently similar to the package substrate SUB in order to apply a counter force to the package substrate SUB and reduce the bow of the semiconductor package 1600 to within tolerances accepted in the industry. For example, the CTE of the stiffener ring SR is smaller than 25 ppm/° C., such as 17 ppm/° C., and the CTE of the package substrate SUB is in a range of 8 ppm/° C. to 25 ppm/° C., such as 17 ppm/° C. In some embodiments, the adhesive layer AD1 includes any suitable adhesive, epoxy, die attach film (DAF), or the like. Alternatively, the adhesive layer AD1 may be a thermally conductive material.

As shown in FIG. 21, the surface S3 (i.e., the illustrated top surface) of the stiffener ring SR is higher than the back surface Ba of the semiconductor die 120a and the back surface Bb of the semiconductor die 120b. However, the disclosure is not limited thereto. In some alternative embodiments, the surface S3 of the stiffener ring SR may be lower than the back surface Ba of the semiconductor die 120a and the back surface Bb of the semiconductor die 120b, or may be laterally aligned with the back surface Ba of the semiconductor die 120a and the back surface Bb of the semiconductor die 120b.

In the conventional semiconductor package, the stress resulted due to CTE mismatch between the semiconductor dies (e.g., CTE=3 ppm/° C.) and the package substrate (e.g., CTE≥14 ppm/° C.) during thermal cycling may be exerted on the encapsulant at the outer corners of the semiconductor dies to cause the crack and/or delamination issue of the encapsulant. In view of this, by virtue of arranging the chamfered corners CC at the outer corners of the semiconductor dies 120 to provide more space for accommodating the encapsulant 150, additional encapsulant 150, which occupies at the regions of the outer corners of the semiconductor dies 120 before chamfering, is capable to provide buffer function to facilitate releasing the thermally-induced stress resulted from CTE mismatch between the semiconductor dies 120 and the package substrate SUB. Thereby, the problem of crack and/or delamination of the encapsulant 150 may be sufficiently alleviated, and the reliability of the semiconductor package 1600 may be improved.

Figure 16:
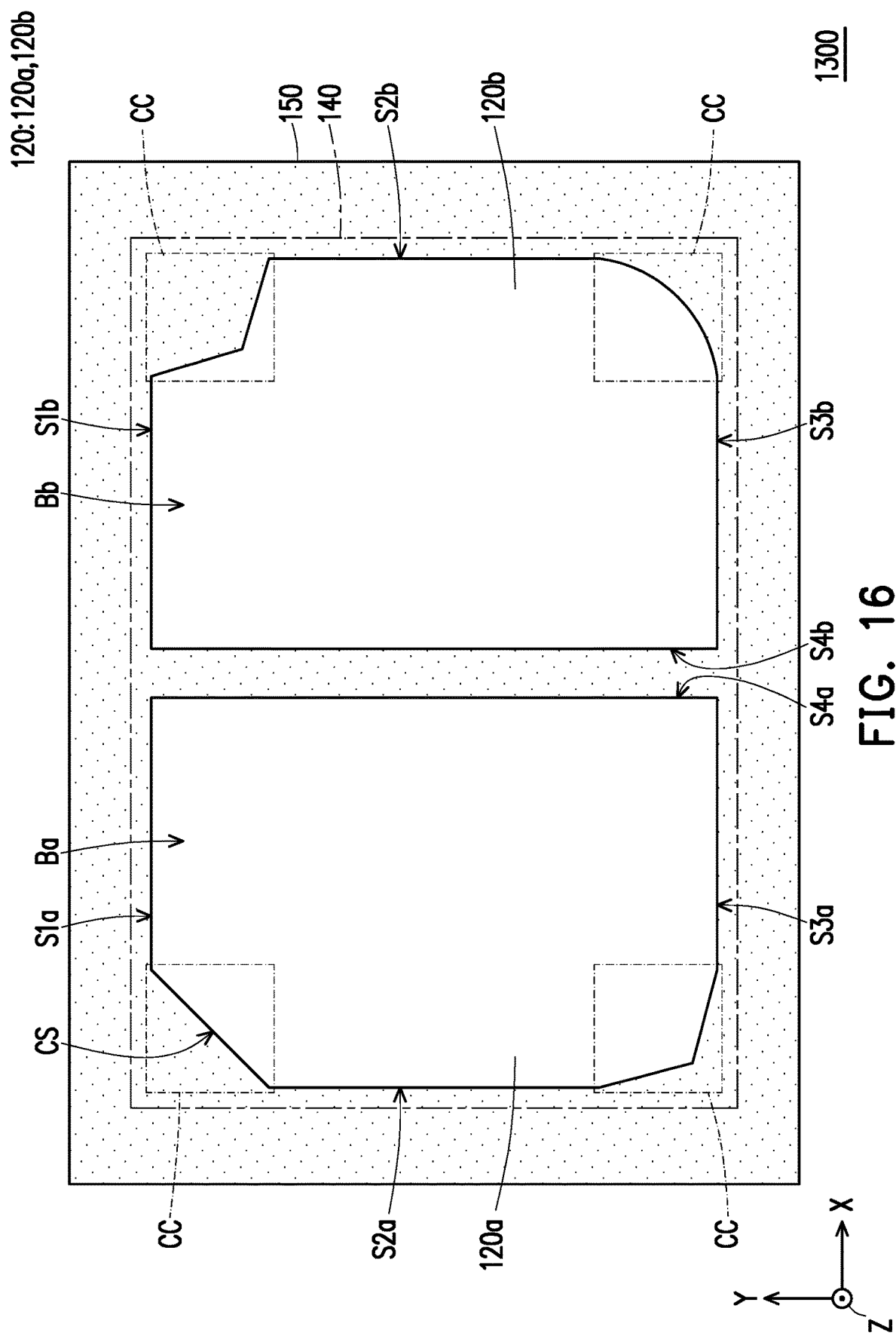
FIG. 16 is a simplified top view of a semiconductor package in accordance with some alternative embodiments of the disclosure.

Although the package structure 1400 includes the semiconductor package 100 described in conjunction with FIGS. 1-3E, those skilled in the art should understand that the semiconductor package 200 described in conjunction with 0062, the semiconductor package 300 described in conjunction with FIG. 6, the semiconductor package 400 described in conjunction with FIG. 7, the semiconductor package 500 described in conjunction with FIG. 8, the semiconductor package 600 described in conjunction with FIG. 9, the semiconductor package 700 described in conjunction with FIG. 10, the semiconductor package 800 described in conjunction with FIG. 11, the semiconductor package 900 described in conjunction with FIG. 12, the semiconductor package 1000 described in conjunction with FIG. 13, the semiconductor package 1100 described in conjunction with FIG. 14, the semiconductor package 1200 described in conjunction with FIG. 15, the semiconductor package 1300 described in conjunction with FIG. 16, the semiconductor package 1400 described in conjunction with FIGS. 15-16, or the semiconductor package 1500 described in conjunction with FIG. 20 may be used in replacement of the semiconductor package 100.

Figure 22:
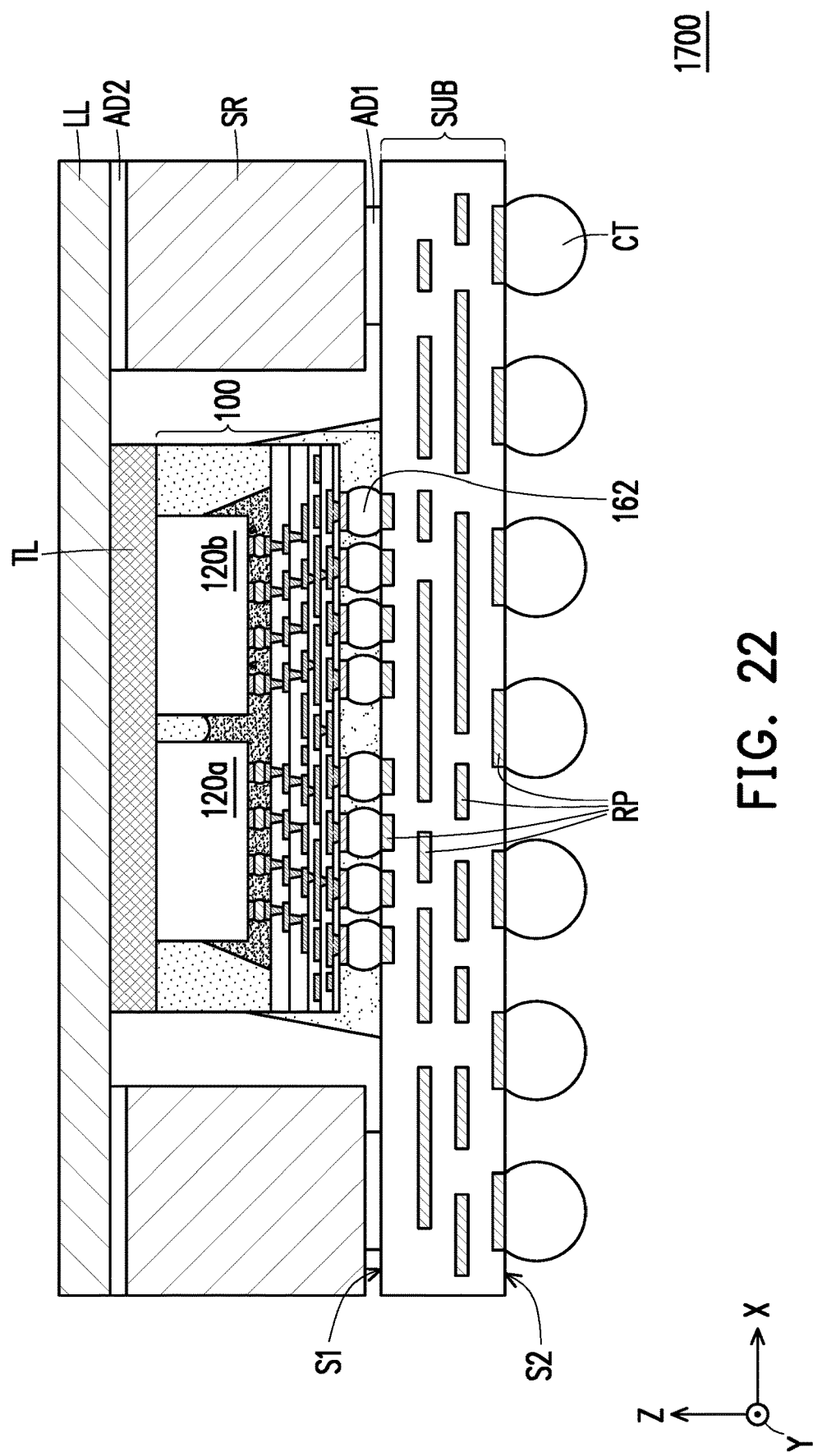
FIG. 22 is a schematic cross-sectional view of a semiconductor package in accordance with some alternative embodiments of the disclosure.

FIG. 22 is a schematic cross-sectional view of a semiconductor package in accordance with some alternative embodiments of the disclosure. The semiconductor package 1700 illustrated in FIG. 22 is similar to the semiconductor package 1600 illustrated in FIG. 21, hence the same reference numerals are used to refer to the same or liked parts, and its detailed description will be omitted herein. The differences between the semiconductor package 1700 and the semiconductor package 1600 will be described below.

Referring to FIG. 22, the semiconductor package 1700 includes a lid layer LL, an adhesive layer AD2 and a thermal interface material (TIM) layer TL. In some embodiments, the lid layer LL is adhered on the stiffener ring SR by the adhesive layer AD2. The lid layer LL may be coupled to the stiffener ring SR to increase the rigid of the stiffener ring SR, thereby reducing the warpage of the semiconductor package 1700. In addition, the lid layer LL may overlay the semiconductor dies 120 of the semiconductor package 100 to prevent the electromagnetic interference (EMI). In some embodiments, the lid layer LL is formed from a metal material with high thermal conductivity (k), such as steel, stainless steel, copper, aluminum, copper tungsten, the like, or combinations thereof. In another embodiment, the lid layer LL includes a ceramic material. In yet another embodiment, the lid layer LL includes a silicon containing material. In yet another embodiment, the lid layer LL includes a composite alloy. In yet another embodiment, the lid layer LL includes a plastic material. In some other embodiments, the lid layer LL is a single contiguous material. In another embodiment, the lid layer LL includes multiple pieces that may be the same or different materials. In some embodiments, the lid layer LL and the stiffener ring SR have the same material. In some alternative embodiments, the lid layer LL and the stiffener ring SR have different materials. In some embodiments, the material of the adhesive layer AD2 is similar to the material of the adhesive layer AD1 mentioned for the semiconductor package 1600. Therefore, the detailed description of the adhesive layer AD2 will be omitted herein.

In some embodiments, the TIM layer TL is located between the semiconductor package 100 and the lid layer LL for heat dissipation. In some embodiments, the TIM layer TL is formed on the semiconductor package 100 before attaching the lid layer LL on the stiffener ring SR. In some embodiments, the material of the TIM layer TL includes Ag, Cu, Sn, In, carbon nanotube (CNT), graphite, or the like. In such case, the thermal conductivity (k) of the TIM layer TL is in a range of about 10 $Wm^{-1}K^{-1}$ to about 30 $Wm^{-1}K^{-1}$, such as about 10 $Wm^{-1}K^{-1}$. In some alternative embodiments, the material of the TIM layer TL includes a polymer material, solder paste, indium solder paste, or the like. In such alternative case, the thermal conductivity (k) of the TIM layer TL is in a range of about 0.1 $Wm^{-1}K^{-1}$ to about 10 $Wm^{-1}K^{-1}$, such as about 5 $Wm^{-1}K^{-1}$. In some embodiments, the semiconductor dies 120 of the semiconductor package 100 may trap heat to become hot spots in the semiconductor package 1700. Therefore, the TIM layer TL thermally couples the semiconductor dies 120 and the lid layer LL to dissipate the heat from the semiconductor dies 120 to the lid layer LL.

Figure 23:
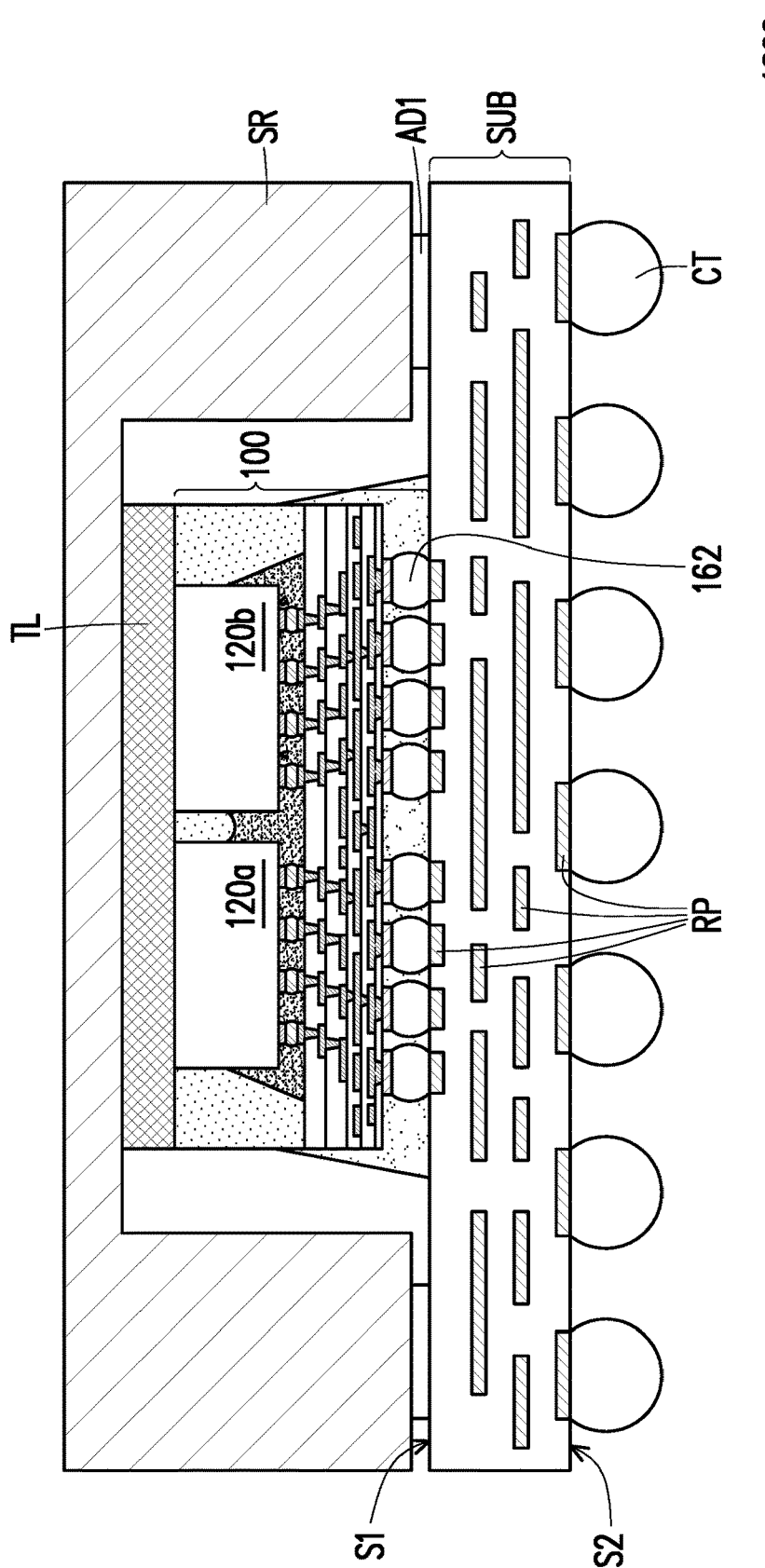
FIG. 23 is a schematic cross-sectional view of a semiconductor package in accordance with some alternative embodiments of the disclosure.

In the present embodiment, the lid layer LL and the stiffener ring SR are independent elements connected by the adhesive layer AD2. However, the disclosure is not limited thereto. In some alternative embodiments, the lid layer LL and the stiffener ring SR may be integrally formed with the same material. For example, referring to FIG. 23, in the semiconductor package 1800, the lid L, which may be regarded as the integrally formed lid layer and stiffener ring, is adhered on the package substrate SUB by the adhesive layer AD1. Further, in the semiconductor package 1800, the TIM layer TL is located between the semiconductor package 100 and the lid L.

In accordance with an embodiment, a semiconductor package includes an interposer, a semiconductor die, a second semiconductor, an underfill layer and an encapsulant. The semiconductor die is disposed over and electrically connected with the interposer, wherein the semiconductor die has a front surface, a back surface, a first side surface and a second side surface, the back surface is opposite to the front surface, the first side surface and the second side surface are connected with the front surface and the back surface, and the semiconductor die comprises a chamfered corner connected with the back surface, the first side surface and the second side surface, the chamfered corner comprises at least one side surface. The underfill layer is disposed between the front surface of the semiconductor die and the interposer. The encapsulant laterally encapsulates the semiconductor die and the underfill layer, wherein the encapsulant is in contact with the chamfered corner of the semiconductor die.

In accordance with an embodiment, a semiconductor package includes an interposer, semiconductor dies, a first underfill layer and an encapsulant. The semiconductor dies are disposed over and electrically connected with the interposer, wherein each of the semiconductor dies has a front surface, a back surface, a first side surface and a second side surface, the back surface is opposite to the front surface, the front surface faces toward the interposer, the first side surface and the second side surface are connected with the front surface and the back surface, and at least one semiconductor die of the semiconductor dies comprises a chamfered outer corner connected with the back surface, the first side surface and the second side surface, the first side surface and the second side surface of the at least one semiconductor die do not face toward other semiconductor dies, the chamfered outer corner comprises at least one side surface. The first underfill layer is disposed between the semiconductor dies and between the semiconductor dies and the interposer. The encapsulant laterally encapsulates the semiconductor dies and the first underfill layer.

In accordance with an embodiment, a semiconductor package includes an interposer, a first semiconductor device, a second semiconductor device, an underfill layer and an encapsulant. The first semiconductor die is disposed over and electrically connected with the interposer, wherein the first semiconductor die has a first side surface, a second side surface and a third side surface, the first semiconductor die comprises a first chamfered corner and a first corner, the first chamfered corner is connected with the first side surface and the second side surface, and the first corner is connected with the first side surface and the third side surface. The second semiconductor die is disposed aside the first semiconductor die and electrically connected with the interposer, wherein the second semiconductor die has a fourth side surface, a fifth side surface and a sixth side surface, the second semiconductor die comprises a second chamfered corner and a second corner, the second chamfered corner is connected with the fourth side surface and the fifth side surface, the second corner is connected with the fourth side surface and the sixth side surface, and the sixth side surface faces toward the third side surface. The underfill layer is disposed between the first semiconductor die and the second semiconductor die, between the first semiconductor die and the interposer, and between the second semiconductor die and the interposer. The encapsulant laterally encapsulates the first semiconductor die, the second semiconductor die and the underfill layer, wherein the encapsulant is in contact with the first chamfered corner and the second chamfered corner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
an interposer;
a semiconductor die disposed over and electrically connected with the interposer, wherein the semiconductor die has a front surface, a back surface, a first side surface and a second side surface, the back surface is opposite to the front surface, the first side surface and the second side surface are connected with the front surface and the back surface, and the semiconductor die comprises a chamfered corner connected with the back surface, the first side surface and the second side surface, the chamfered corner comprises at least one side surface;
an underfill layer disposed between the front surface of the semiconductor die and the interposer; and
an encapsulant laterally encapsulating the semiconductor die and the underfill layer, wherein the encapsulant is in contact with the chamfered corner of the semiconductor die, and a side of the at least one side surface is at the same level height as a top surface of the encapsulant.

2. The semiconductor package of claim 1, wherein a first offset of the chamfered corner along a first direction parallel to the first side surface is greater than or equal to about 5 micrometers and less than or equal to a half of a first length of the semiconductor die, and a second offset of the chamfered corner along a second direction parallel to the second side surface is greater than or equal to about 5 micrometers and less than or equal to a half of a second length of the semiconductor die.

3. The semiconductor package of claim 1, wherein the at least one side surface of the chamfered corner comprises a third side surface and a fourth side surface, the third side surface extends between the first side surface and the fourth side surface, the fourth side surface extends between the third side surface and the second side surface, an exterior angle between the third side surface and the first side surface is greater than 0 degree and less than about 90 degree, and an exterior angle between the fourth side surface and a virtual plane paralleled with the first side surface is greater than 0 degree and less than about 90 degree.

4. The semiconductor package of claim 3, wherein the exterior angle between the third side surface and the first side surface is the same as the exterior angle between the fourth side surface and the virtual plane paralleled with the first side surface.

5. The semiconductor package of claim 3, wherein the exterior angle between the third side surface and the first side surface is different from the exterior angle between the fourth side surface and the virtual plane paralleled with the first side surface.

6. The semiconductor package of claim 1, wherein the at least one side surface of the chamfered corner comprises a third side surface and a fourth side surface, the third side surface connects the first side surface and the fourth side surface, at least one of an exterior angle between the first side surface and the third side surface and an exterior angle between the fourth side surface and the second side surface is about 90 degree, and both of the third side surface and the fourth side surface are connected with the back surface.

7. The semiconductor package of claim 1, wherein the at least one side surface of the chamfered corner comprises a curved side surface.

8. The semiconductor package of claim 6, wherein the curved side surface has a concave profile or a convex profile.

9. The semiconductor package of claim 1, wherein the underfill layer is in contact with the at least one side surface of the chamfered corner.

10. A semiconductor package, comprising:
an interposer;
semiconductor dies disposed over and electrically connected with the interposer, wherein each of the semiconductor dies has a front surface, a back surface, a first side surface and a second side surface, the back surface is opposite to the front surface, the first side surface and the second side surface are connected with the front surface and the back surface, and at least one semiconductor die of the semiconductor dies comprises a chamfered outer corner connected with the back surface, the first side surface and the second side surface, the first side surface and the second side surface of the at least one semiconductor die do not face toward other semiconductor dies, the chamfered outer corner comprises at least one side surface;
a first underfill layer disposed between the semiconductor dies and between the semiconductor dies and the interposer; and
an encapsulant laterally encapsulating the semiconductor dies and the first underfill layer, and a side of the at least one side surface is at the same level height as a top surface of the encapsulant.

11. The semiconductor package of claim 10, wherein a first offset of the chamfered corner along a first direction parallel to the first side surface is greater than or equal to about 5 micrometers and less than or equal to a half of a first length of the at least one semiconductor die, and a second offset of the chamfered corner along a second direction parallel to the second side surface is greater than or equal to about 5 micrometers and less than or equal to a half of a second length of the at least one semiconductor die.

12. The semiconductor package of claim 10, further comprising:
a circuit substrate;
first conductive terminals disposed on and electrically connected to the circuit substrate;
second conductive terminals disposed on and electrically connected to the circuit substrate, wherein the interposer is electrically connected to the circuit substrate through the first conductive terminals, and the first conductive terminals and the second conductive terminals are disposed on opposite sides of the circuit substrate; and
a second underfill layer disposed between the interposer and the circuit substrate, wherein the second underfill layer encapsulates the first conductive terminals.

13. The semiconductor package of claim 10, further comprising:
a stiffener ring disposed on the circuit substrate to surround the semiconductor dies.

14. The semiconductor package of claim 13, further comprising:
a lid layer, adhered on the stiffener ring and overlying the semiconductor dies; and
a thermal interface material (TIM) layer at least disposed between the semiconductor dies and the lid layer.

15. The semiconductor package of claim 10, wherein the at least one side surface of the chamfered outer corner comprises a third side surface and a fourth side surface, the third side surface connects the first side surface and the fourth side surface, and an obtuse angle is included between the third side surface and the fourth side surface, and both the third side surface and the fourth side surface are connected with the back surface.

16. The semiconductor package of claim 10, wherein the at least one side surface of the chamfered outer corner comprises a third side surface and a fourth side surface, the third side surface connects the first side surface and the fourth side surface, and a right angle is included between the third side surface and the fourth side surface.

17. The semiconductor package of claim 10, wherein the at least one side surface of the chamfered corner comprises a curved side surface.

18. A semiconductor package, comprising:
an interposer;
a first semiconductor die disposed over and electrically connected with the interposer, wherein the first semiconductor die has a front surface, a back surface, a first side surface, a second side surface and a third side surface, the back surface is opposite to the front surface, the first side surface, the second side surface and the third side surface are connected with the front surface and the back surface, the first semiconductor die comprises a first chamfered corner and a first corner, the first chamfered corner is connected with the back surface, the first side surface and the second side surface, and the first corner is connected with the first side surface and the third side surface;
a second semiconductor die disposed aside the first semiconductor die and electrically connected with the interposer, wherein the second semiconductor die has a fourth side surface, a fifth side surface and a sixth side surface, the second semiconductor die comprises a second chamfered corner and a second corner, the second chamfered corner is connected with the fourth side surface and the fifth side surface, the second corner is connected with the fourth side surface and the sixth side surface, and the sixth side surface faces toward the third side surface;
an underfill layer disposed between the first semiconductor die and the second semiconductor die, between the first semiconductor die and the interposer, and between the second semiconductor die and the interposer; and
an encapsulant laterally encapsulating the first semiconductor die, the second semiconductor die and the underfill layer, wherein the encapsulant is in contact with the first chamfered corner and the second chamfered corner, and a side of the first chamfered corner is at the same level height as a top surface of the encapsulant.

19. The semiconductor package of claim 18, wherein a right angle is included between the first side surface and the third side surface and between the fourth side surface and the sixth side surface.

20. The semiconductor package of claim 18, wherein the underfill layer is in contact with the first chamfered corner and the second chamfered corner.

* * * * *